United States Patent
Shibazaki

(10) Patent No.: US 8,274,639 B2
(45) Date of Patent: Sep. 25, 2012

(54) STAGE DEVICE, PATTERN FORMATION APPARATUS, EXPOSURE APPARATUS, STAGE DRIVE METHOD, EXPOSURE METHOD, AND DEVICE MANUFACTURING METHOD

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 650 days.

(21) Appl. No.: 12/433,063

(22) Filed: Apr. 30, 2009

(65) Prior Publication Data

US 2009/0284723 A1 Nov. 19, 2009

Related U.S. Application Data

(60) Provisional application No. 61/071,987, filed on May 29, 2008.

(30) Foreign Application Priority Data

Apr. 30, 2008 (JP) .................... 2008-119233

(51) Int. Cl.
*G03B 27/58* (2006.01)
*G01B 11/14* (2006.01)
(52) U.S. Cl. .......................... 355/72; 356/616
(58) Field of Classification Search ............. 355/53, 355/72; 356/614, 616
See application file for complete search history.

(56) References Cited

U.S. PATENT DOCUMENTS

| | | | |
|---|---|---|---|
| 4,780,617 A | 10/1988 | Umatate et al. | |
| 5,196,745 A | 3/1993 | Trumper | |
| 5,283,434 A * | 2/1994 | Ishizuka et al. | 250/237 G |
| 5,448,332 A | 9/1995 | Sakakibara et al. | |
| 5,610,715 A | 3/1997 | Yoshii et al. | |
| 5,646,413 A | 7/1997 | Nishi | |
| 6,611,316 B2 | 8/2003 | Sewell | |
| 6,778,257 B2 | 8/2004 | Bleeker et al. | |
| 6,819,425 B2 | 11/2004 | Kwan | |
| 7,023,610 B2 | 4/2006 | Ohtsuki et al. | |
| 7,025,498 B2 | 4/2006 | del Puerto | |

(Continued)

FOREIGN PATENT DOCUMENTS

JP A-4-198714 7/1992

(Continued)

OTHER PUBLICATIONS

PCT Written Opinion of the International Searching Authority in PCT/JP2009/001949 mailed Jun. 9, 2009 w/English-language Translation.

(Continued)

*Primary Examiner* — Hung Henry Nguyen
*Assistant Examiner* — Steven H Whitesell Gordon
(74) *Attorney, Agent, or Firm* — Oliff & Berridge, PLC

(57) ABSTRACT

A stage device is equipped with: a wafer stage that has a coarse movement stage that moves along an XY plane and a table that is finely movable in at least a direction parallel to the XY plane; and an encoder system. A plurality of encoder heads are arranged on the coarse movement stage. Each of the heads irradiates a first grating section placed parallel to the XY plane and a second grating section arranged on the table with measurement beams, respectively, and receives diffracted lights from each of the first and second grating sections. The encoder system measures positional information of the table (wafer stage) within the XY plane based on an output of at least one encoder head that faces the first and second grating sections.

91 Claims, 5 Drawing Sheets

U.S. PATENT DOCUMENTS

| | | |
|---|---|---|
| 7,102,729 B2 | 9/2006 | Renkens et al. |
| 7,161,659 B2 | 1/2007 | Van Den Brink et al. |
| 7,289,212 B2 | 10/2007 | Kwan |
| 2002/0018220 A1 | 2/2002 | Aoki |
| 2003/0025890 A1 | 2/2003 | Nishinaga |
| 2004/0051881 A1* | 3/2004 | Holzapfel et al. ............ 356/616 |
| 2005/0128461 A1 | 6/2005 | Beems et al. |
| 2005/0259234 A1 | 11/2005 | Hirukawa et al. |
| 2006/0023178 A1 | 2/2006 | Loopstra et al. |
| 2006/0023194 A1 | 2/2006 | Loopstra et al. |
| 2006/0139595 A1 | 6/2006 | Koenen et al. |
| 2006/0170892 A1 | 8/2006 | Koenen et al. |
| 2006/0227308 A1 | 10/2006 | Brink et al. |
| 2006/0227309 A1 | 10/2006 | Loopstra et al. |
| 2007/0076218 A1 | 4/2007 | Van Empel et al. |
| 2007/0263197 A1 | 11/2007 | Luttikhuis et al. |
| 2007/0273860 A1* | 11/2007 | Tanaka ............................ 355/72 |
| 2008/0106722 A1 | 5/2008 | Shibazaki |
| 2009/0284724 A1* | 11/2009 | Kanaya .......................... 355/53 |

FOREIGN PATENT DOCUMENTS

| | | |
|---|---|---|
| JP | A-9-269249 | 10/1997 |
| JP | A-2001-126977 | 5/2001 |
| JP | A-2001-135561 | 5/2001 |
| JP | A-2005-203386 | 7/2005 |
| JP | A-2005-285881 | 10/2005 |
| JP | A-2006-332656 | 12/2006 |
| JP | A-2007-129194 | 5/2007 |
| JP | A-2007-129202 | 5/2007 |
| WO | WO 01/35168 A1 | 5/2001 |
| WO | WO 2008/026732 A1 | 3/2008 |

OTHER PUBLICATIONS

May 16, 2012 Office Action issued in Chinese Application No. 200980115333.6 (with translation).

* cited by examiner

STAGE DEVICE, PATTERN FORMATION APPARATUS, EXPOSURE APPARATUS, STAGE DRIVE METHOD, EXPOSURE METHOD, AND DEVICE MANUFACTURING METHOD

CROSS-REFERENCE TO RELATED APPLICATIONS

This non-provisional application claims the benefit of Provisional Application No. 61/071,987 filed May 29, 2008, the disclosure of which is hereby incorporated herein by reference in its entirety.

BACKGROUND OF THE INVENTION

1. Field of the Invention

The present invention relates to stage devices, pattern formation apparatuses, exposure apparatuses, stage drive methods, exposure methods, and device manufacturing methods, and more particularly to a stage device equipped with a coarse/fine movement stage that moves along a predetermined plane, a pattern formation apparatus equipped with the stage device, an exposure apparatus equipped with the stage device, a stage drive method of driving the coarse/fine movement stage, an exposure method that makes use of the stage drive method, and a device manufacturing method that uses the exposure apparatus or the exposure method described above.

2. Description of the Background Art

Conventionally, in a lithography process for manufacturing electron devices (microdevices) such as semiconductor devices (integrated circuits or the like) and liquid crystal display devices, an exposure apparatus such as a projection exposure apparatus by a step-and-repeat method (a so-called stepper) or a projection exposure apparatus by a step-and-scan method (a so-called scanning stepper (which is also called a scanner) is mainly used.

However, it is certain that the integration of the semiconductor devices becomes much higher and circuit patterns to be formed on a wafer become finer according to the higher integration, in the future, and therefore further improvement of position detection accuracy of a wafer or the like is required for an exposure apparatus that is a mass-production apparatus of semiconductor devices.

For example, U.S. Patent Application Publication No. 2006/0227309 discloses an exposure apparatus in which an encoder-type sensor (an encoder head) is mounted on a substrate table. Especially, in the case where the encoder head disclosed in the U.S. Patent Application Publication No. 2006/0227309 is mounted on a coarse/fine movement stage that has a coarse movement stage and a fine movement stage that moves on the coarse movement stage, it is usual to mount the encoder head on the fine movement stage. In this case, however, wiring needs to be installed between the coarse movement stage and the fine movement stage (depending on the circumstances, both the stages need to be connected by optical fibers) in order to supply electric power to the encoder head, but as the fine movement stage moves on the coarse movement stage, there was a possibility that a tensile force acting on the wiring or the like prevented a smooth operation of the fine movement stage. In particular, in the case where a plurality of encoder heads were mounted on the fine movement stage, there was a risk that the drag of the wiring or the like caused a big problem.

SUMMARY OF THE INVENTION

According to a first aspect of the present invention, there is provided a first stage device, comprising: a coarse/fine movement stage including a coarse movement stage that moves along a predetermined plane and a fine movement stage that is finely movable on the coarse movement stage; and a measurement device that has an encoder head arranged on the coarse movement stage, and measures positional information of the fine movement stage in a predetermined direction, based on first positional information obtained by irradiating a first grating section placed external to the coarse/fine movement stage so as to be substantially parallel to the predetermined plane with a first measurement beam and receiving a diffracted light from the first grating section and on second positional information that is relative positional information between the coarse movement stage and the fine movement stage.

With this device, because the encoder head is arranged on the coarse movement stage, even if the fine movement stage moves on the coarse movement stage, the movement of the fine movement stage is not blocked by a tensile force of the wiring or the like. And, based on the first positional information obtained by irradiating the first grating section with the first measurement beam from the encoder head and receiving a diffracted light from the first grating section and on the second positional information that is relative positional information between the coarse movement stage and the fine movement stage, the measurement device measures positional information of the fine movement stage in the predetermined direction with high precision. Accordingly, it becomes possible to drive the fine movement stage and/or the coarse movement stage with high precision.

According to a second aspect of the present invention, there is provided a second stage device, comprising: a coarse/fine movement stage including a coarse movement stage that moves along a predetermined plane and a fine movement stage that is finely movable on the coarse movement stage; and a measurement device that has an encoder head arranged on the coarse movement stage, and measures positional information of the fine movement stage in a predetermined direction by irradiating a first grating section placed external to the coarse/fine movement stage so as to be substantially parallel to the predetermined plane and a second grating section placed on the fine movement stage with a first measurement beam and a second measurement beam, respectively, and receiving diffracted lights from the first and second grating sections.

With this device, because the encoder head is arranged on the coarse movement stage, even if the fine movement stage moves on the coarse movement stage, the movement of the fine movement stage is not blocked by a tensile force of the wiring or the like. And, the measurement device measures positional information of the fine movement stage in the predetermined direction with high precision, by irradiating the first and second grating sections with the first and second measurement beams, respectively, from the encoder head, and receiving diffracted lights from the first and second grating sections. Accordingly, it becomes possible to drive the fine movement stage and/or the coarse movement stage with high precision.

According to a third aspect of the present invention, there is provided a third stage device, comprising: a coarse/fine movement stage including a coarse movement stage that moves along a predetermined plane and a fine movement stage that is finely movable on the coarse movement stage and has a light-transmitting section in at least a part thereof; a measurement device that has one encoder head or two or more encoder heads fixed to the coarse movement stage, and measures positional information of the coarse/fine movement stage within the predetermined plane based on an output of at least one of the encoder heads that irradiates a first grating section placed external to the coarse/fine movement stage so as to be substantially parallel to the predetermined plan, with a first measurement beam via the light-transmitting section and receives a diffracted light from the first grating section via the light-transmitting section.

With this device, since one encoder head or two or more encoder heads is/are fixed to the coarse movement stage, even if the fine movement stage moves on the coarse movement stage, the movement of the fine movement stage is not blocked by a tensile force of the wiring or the like. And, based on the output of at least one encoder head that irradiates the first grating section with the first measurement beam via the light-transmitting section of the fine movement stage and receives diffracted lights from the first grating section via the light-transmitting section, the measurement device measures positional information of the coarse/fine movement stage within the predetermined plane with high precision. Accordingly, it becomes possible to drive the coarse/fine movement stage with high precision.

According to a fourth aspect of the present invention, there is provided a pattern formation apparatus that forms a pattern on an object, the apparatus comprising: any one of the first to third stage devices of the present invention, in which the object is mounted on the fine movement stage; and a patterning device that generates a pattern on the object mounted on the fine movement stage.

With this apparatus, since the patterning device generates a pattern on the object mounted on the fine movement stage that can be driven with high precision, it becomes possible to form the pattern on the object with high precision.

According to a fifth aspect of the present invention, there is provided an exposure apparatus that forms a pattern on an object with irradiation of an energy beam, the apparatus comprising: any one of the first to third stage devices of the present invention, in which the object is mounted on the fine movement stage; and a patterning device that irradiates the object mounted on the fine movement stage with the energy beam.

With this apparatus, the patterning device irradiates the object mounted on the fine movement stage that can be driven with high precision, with the energy beam, and therefore it becomes possible to form the pattern on the object with high precision by exposing the object with the energy beam.

According to a sixth aspect of the present invention, there is provided a device manufacturing method, comprising: exposing an object using the exposure apparatus of the present invention; and developing the object that has been exposed.

According to a seventh aspect of the present invention, there is provided a first stage drive method of driving a coarse/fine movement stage that has a coarse movement stage that moves along a predetermined plane and a fine movement stage that is finely movable on the coarse movement stage, the method comprising: measuring positional information of the fine movement stage in a predetermined direction, based on first positional information obtained from an output of an encoder head arranged on the coarse movement stage that irradiates a first grating section placed external to the coarse/fine movement stage so as to be substantially parallel to the predetermined plane with a first measurement beam and receives a diffracted light from the first grating section, and on second positional information that is relative positional information between the coarse movement stage and the fine movement stage.

With this method, because the encoder head is arranged on the coarse movement stage, even if the fine movement stage moves on the coarse movement stage, the movement of the fine movement stage is not blocked by a tensile force of the wiring or the like. And, when the coarse/fine movement stage moves along the predetermined plane, positional information of the fine movement stage in the predetermined direction is measured with high precision, based on the first positional information obtained from the output of the encoder head that irradiates the first grating section with the first measurement beam and receives a diffracted light from the first grating section and on the second positional information that is relative positional information between the coarse movement stage and the fine movement stage. Accordingly, it becomes possible to drive the fine movement stage and/or the coarse movement stage with high precision.

According to an eighth aspect of the present invention, there is provided a second stage drive method of driving a coarse/fine movement stage that has a coarse movement stage that moves along a predetermined plane and a fine movement stage that is finely movable on the coarse movement stage, the method comprising: measuring positional information of the fine movement stage in a predetermined direction, based on an output of an encoder head arranged on the coarse movement stage that irradiates a first grating section placed external to the coarse/fine movement stage so as to be substantially parallel to the predetermined plane and a second grating section placed on the fine movement stage with a first measurement beam and a second measurement beam, respectively, and receives diffracted lights from the first and second grating sections.

With this method, because the encoder head is arranged on the coarse movement stage, even if the fine movement stage moves on the coarse movement stage, the movement of the fine movement stage is not blocked by a tensile force of the wiring or the like. And, when the coarse/fine movement stage moves along the predetermined plane, positional information of the fine movement stage in the predetermined direction is measured with high precision, based on the output of the encoder head that irradiates the first and second grating sections with the first and second measurement beams, respectively, and receives diffracted lights from the first and second grating sections. Accordingly, it becomes possible to drive the fine movement stage and/or the coarse movement stage with high precision.

According to a ninth aspect of the present invention, there is provided a third stage drive method of driving a coarse/fine movement stage that has a coarse movement stage that moves along a predetermined plane and a fine movement stage that is finely movable on the coarse movement stage, the method comprising: measuring positional information of the coarse/fine movement stage within the predetermined plane, based on an output of at least one encoder head, from among one encoder head or two or more encoder heads fixed to the coarse movement stage, which irradiates a first grating section placed external to the coarse/fine movement stage so as to be substantially parallel to the predetermined plane with a first measurement beam via a light-transmitting section of the fine movement stage and receives a diffracted light from the first grating section via the light-transmitting section; and driving the coarse/fine movement stage based on the positional information of the coarse/fine movement stage that has been measured.

With this method, since one encoder head or two or more encoder heads is/are fixed to the coarse movement stage, even if the fine movement stage moves on the coarse movement stage, the movement of the fine movement stage is not blocked by a tensile force of the wiring or the like. Further, in the case where the coarse/fine movement stage moves along the predetermine plane, positional information of the coarse/fine movement stage within the predetermined plane is measured with high precision, based on the output of at least one encoder head that irradiates the first grating section with the first measurement beam via the light-transmitting section of the fine movement stage and receives diffracted lights from the first grating section via the light-transmitting section. Accordingly, it becomes possible to drive the coarse/fine movement stage with high precision.

According to a tenth aspect of the present invention, there is provided an exposure method of forming a pattern on an object with irradiation of an energy beam, the method comprising: driving a coarse/fine movement stage in which the object is mounted on the fine movement stage, by using any one of the first to third stage drive methods of the present invention.

With this method, since the fine movement stage on which the object is mounted is driven with high precision using any one of the first to third stage drive methods of the present invention, it becomes possible to form the pattern on the object with high precision by exposing the object with the energy beam.

According to an eleventh aspect of the present invention, there is provided a device manufacturing method, comprising: exposing an object using the exposure method of the present invention; and developing the object that has been exposed.

BRIEF DESCRIPTION OF THE DRAWINGS

In the accompanying drawings.

DESCRIPTION OF THE EMBODIMENTS

An embodiment of the present invention is described below, with reference to FIGS. 1 to 5.

Figure 1:
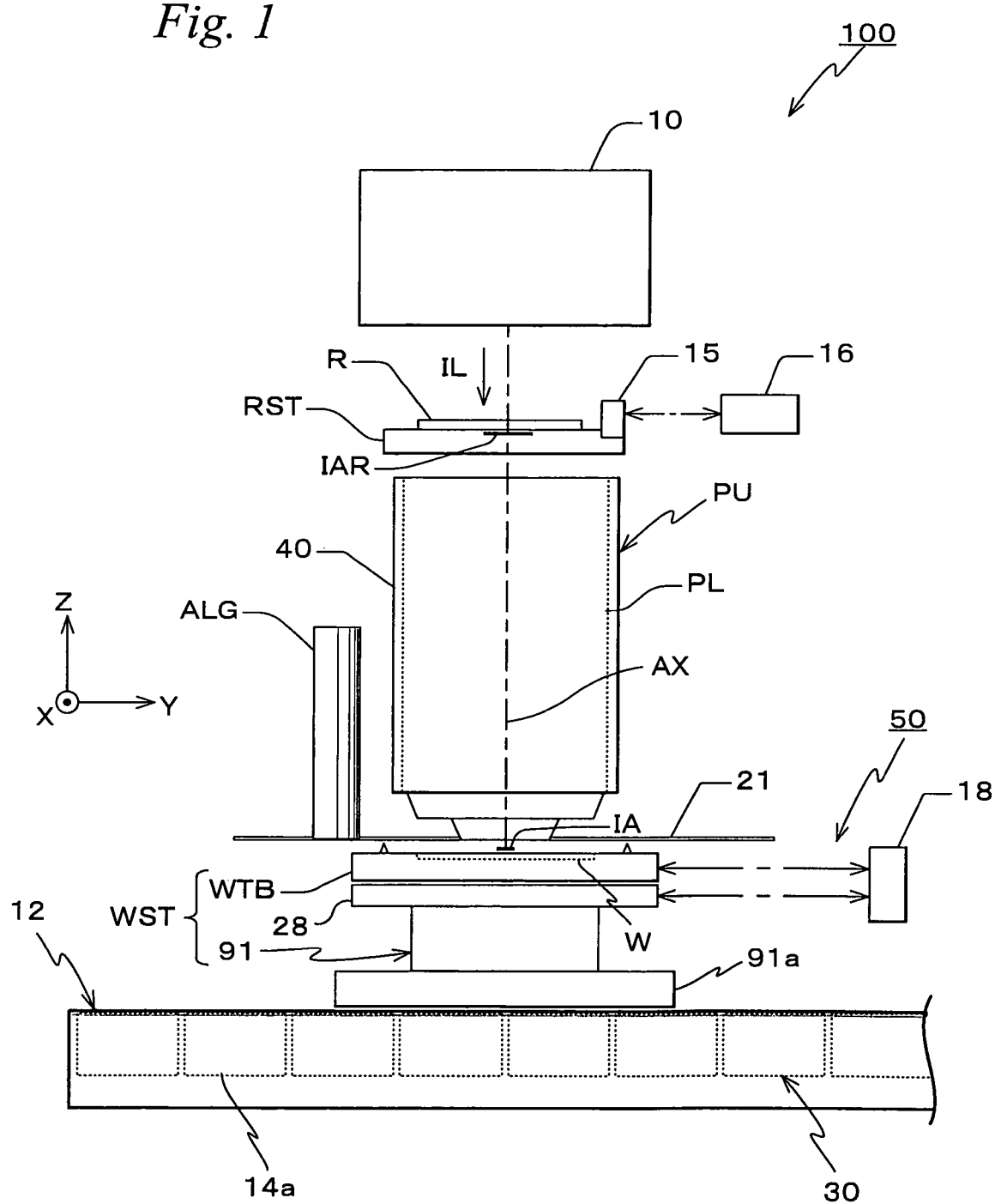
FIG. 1 is a view schematically showing a configuration of an exposure apparatus of an embodiment.

FIG. 1 shows a schematic configuration of an exposure apparatus 100 of the embodiment. Exposure apparatus 100 is a projection exposure apparatus by a step-and-scan method, that is, a so-called scanner. As is described later, a projection optical system PL is provided in this embodiment, and in the description below, the explanation is given assuming that a direction parallel to an optical axis AX of projection optical system PL is a Z-axis direction, a direction in which a reticle and a wafer are relatively scanned within a plane orthogonal to the Z-axis direction is a Y-axis direction, and a direction that is orthogonal to a Z-axis and a Y-axis is an X-axis direction, and rotation (inclination) directions about an X-axis, the Y-axis and the Z-axis are θx, θy and θz directions, respectively.

Exposure apparatus 100 is equipped with an illumination system 10, a reticle stage RST that holds a reticle R, a projection unit PU, a wafer stage device 50 including a wafer stage WST on which wafer W is mounted, their control system, and the like.

As is disclosed in, for example, U.S. Patent Application Publication No. 2003/0025890 and the like, illumination system 10 includes: a light source; and an illumination optical system that has an illuminance uniformity optical system containing an optical integrator and the like, and a reticle blind and the like (none of which are shown). Illumination system 10 illuminates a slit-shaped illumination area IAR, which is defined by the reticle blind (masking system), on reticle R with an illumination light (exposure light) IL with substantially uniform illuminance. In this case, as illumination light IL, an ArF excimer laser light (wavelength: 193 nm) is used, as an example.

On reticle stage RST, reticle R having a pattern surface (lower surface in FIG. 1) on which a circuit pattern and the like are formed is fixed by, for example, vacuum suction. Reticle stage RST is finely drivable within the XY plane and also drivable at a predetermined scanning speed in a scanning direction (which is the Y-axis direction being a lateral direction of the page surface of FIG. 1), with a reticle stage drive system 11 including, for example, a linear motor or the like.

Positional information (including the position in the θz direction, i.e. information of θz rotation) of reticle stage RST within the XY plane (movement plane) is constantly detected at a resolution of, for example, around 0.25 nm with a reticle laser interferometer (hereinafter, referred to as a "reticle interferometer") 16, which irradiates a movable mirror 15 (in actuality, a Y movable mirror (or a retroreflector) having a reflection surface orthogonal to the Y-axis direction and an X movable mirror having a reflection surface orthogonal to the X-axis direction are arranged shown in FIG. 1 with a measurement beam.

Projection unit PU is placed below (on the −Z side of) reticle stage RST in FIG. 1 and held by a part of a body (not shown). Projection unit PU has a barrel 40, and projection optical system PL which is held by barrel 40 and is composed of a plurality of optical elements. As projection optical system PL, for example, a dioptric system that is composed of a plurality of optical elements (lens elements) disposed along optical axis AX parallel to the Z-axis direction is used. Projection optical system PL is, for example, both-side telecentric and has a predetermined projection magnification (e.g. one-quarter, one-fifth, one-eighth times, or the like) Therefore, when illumination area IAR is illuminated with illumination light IL from illumination system 10, illumination light IL having passed through reticle R whose pattern surface is placed substantially coincident with a first plane (object plane) of projection optical system PL forms a reduced image of a circuit pattern (a reduced image of apart of a circuit pattern) of reticle R within illumination area IAR, on an area (exposure area) IA that is conjugate to illumination area IAR described previously on wafer W, which is placed on a second plane (image plane) side of projection optical system PL and whose surface is coated with a resist (sensitive agent), via projection optical system PL. Then, by moving reticle R relative to illumination area IAR (illumination light IL) in the scanning direction (Y-axis direction) and also moving wafer W relative to exposure area IA (illumination light IL) in the scanning direction (Y-axis direction) by synchronous drive of reticle stage RST and wafer stage WST, scanning exposure of one shot area (divided area) on wafer W is performed, and a pattern of reticle R is transferred to the shot area. More specifically, in the embodiment, a pattern of reticle R is generated on wafer W by illumination system 10 and projection optical system PL, and the pattern is formed on wafer W by exposure of a sensitive layer (resist layer) on wafer W with illumination light IL.

On the periphery of a −Z side end of barrel 40, a scale plate 21 is placed parallel to the XY plane, for example, at a height at which its surface is substantially flush with the lower end surface of barrel 40. In the embodiment, scale plate 21 is composed of a rectangular plate that has a circular opening in a part of which the −Z side end of barrel 40 is inserted and a circular opening in which a −Z side end of an alignment system (to be described later) is inserted, and scale plate 21 is supported in a suspended state by the body (not shown). In the embodiment, scale plate 21 is supported in a suspended state by a main frame (a metrology frame) (not shown) that supports projection unit PU. On the lower surface (−Z side surface) of scale plate 21, as a two-dimensional grating, a reflective-type two-dimensional diffraction grating RG (refer to FIGS. 3 and 4) is formed, which is composed of a grating whose periodic direction is in the Y-axis direction with a predetermined pitch, e.g. 1 μm pitch, and a grating whose periodic direction is in the X-axis direction with a predetermined pitch, e.g. 1 μm pitch. This diffraction grating RG covers the movement range of wafer stage WST.

Wafer stage device 50 is equipped with a stage base 12 that is supported almost horizontally by a plurality (e.g. 3 or 4) of vibration isolating mechanisms (omitted in the drawings) on a floor surface, wafer stage WST that is placed above stage base 12, a wafer stage drive system 27 (partially shown in FIG. 1, refer to FIG. 5) that drives wafer stage WST, an encoder system and a wafer laser interferometer system (to be described later), and the like.

Stage base 12 is made up of a member having a tabular outer shape, and its upper surface is finished so as to have a very high level of flatness, and serves as a guide plane used when wafer stage WST moves. Inside stage base 12, a coil unit is housed, which includes a plurality of coils 14a placed in a matrix shape with the XY two dimensional directions serving as a row direction and a column direction.

Figure 2:
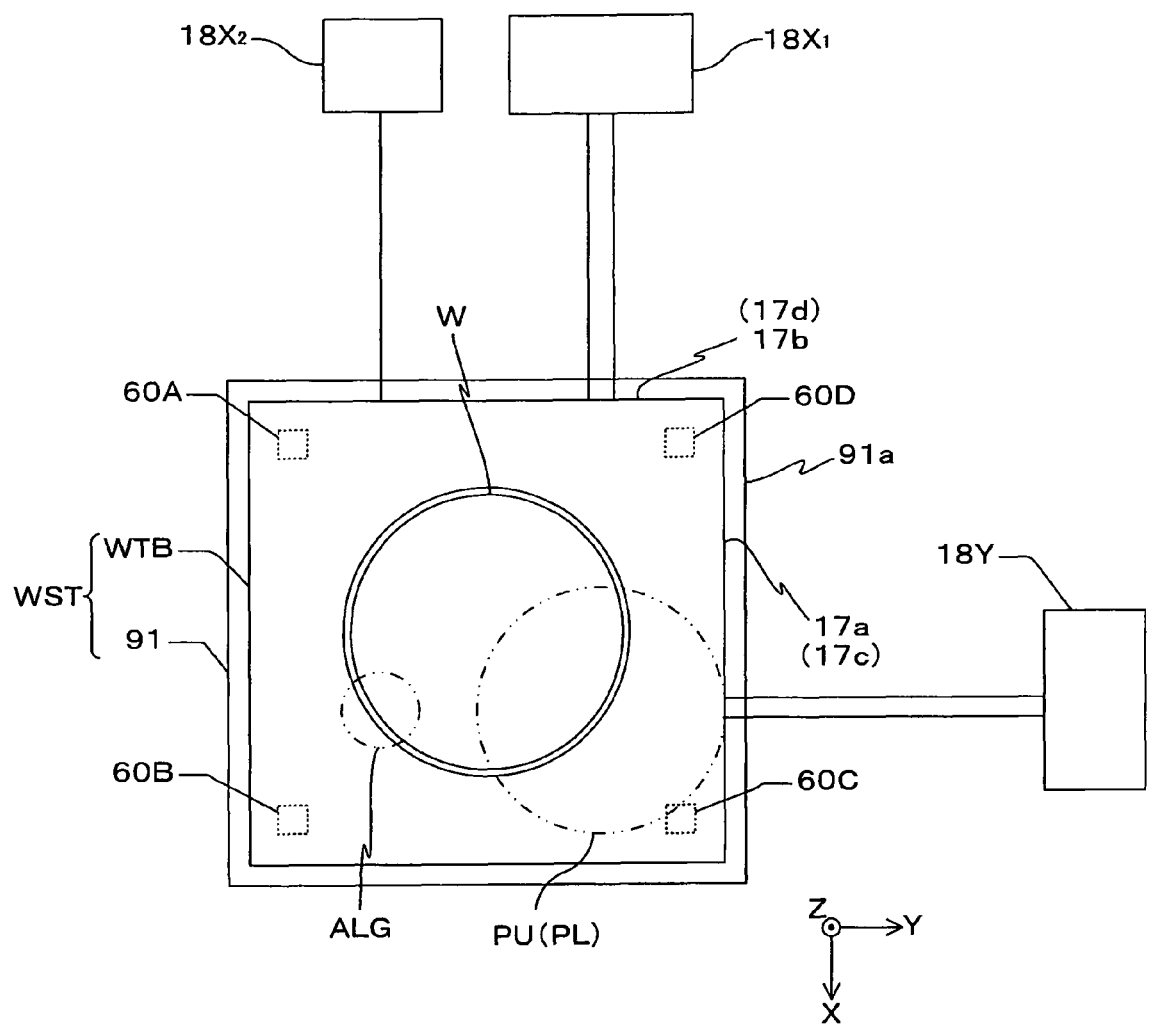
FIG. 2 is a view used to explain a placement of encoder heads and interferometers.

As shown in FIG. 1, wafer stage WST has a wafer coarse movement stage (hereinafter, shortly referred to as a coarse movement stage) 91 and a wafer table WTB that is supported in a noncontact manner with respect to coarse movement stage 91 by a drive mechanism (not shown) that includes, for example, a voice coil motor or the like. Wafer table WTB is also referred to as a wafer fine movement stage. As shown in FIG. 2, wafer table WTB is composed of a plate-like member having substantially a square shape in a planar view (when viewed from above), and is finely driven in directions of six degrees of freedom, which are the X-axis direction, the Y-axis direction, the Z-axis direction, the θx direction, the θy direction and the θz direction, with a drive mechanism (not shown). Coarse movement stage 91 is equipped with: a main section having a rectangular parallelepiped shape (like a square prism having a low height), which has a square-shaped flange section 28 arranged on an outer circumference of an upper end thereof and having an outer edge substantially overlap with that of wafer table WTB; and a slider section 91a that is integrally arranged on a bottom portion of the main section. Slider section 91a has a magnetic unit composed of a plurality of magnets that are XY-two-dimensionally disposed within the XY plane, a housing that houses the magnetic unit, and a plurality of air bearings arranged on the periphery of the bottom surface of the housing. The magnetic unit constitutes, together with the coil unit described earlier, a planar motor 30 by Lorentz electromagnetic force drive, which is disclosed in, for example, U.S. Pat. No. 5,196,745 and the like. Incidentally, planar motor 30 is not limited to a planar motor by a Lorentz electromagnetic force drive method, but a planar motor by a variable magnetoresistance drive method can also be used.

Wafer stage WST (coarse movement stage 91) is supported by levitation via a predetermined clearance, e.g. a clearance around several μm, above stage base 12 with the plurality of air bearings described above, and is driven in the X-axis direction, the Y-axis direction and the θz direction with planar motor 30 described above. Incidentally, it is also possible to drive wafer stage WST in the directions of six degrees of freedom with planar motor 30.

Figure 5:
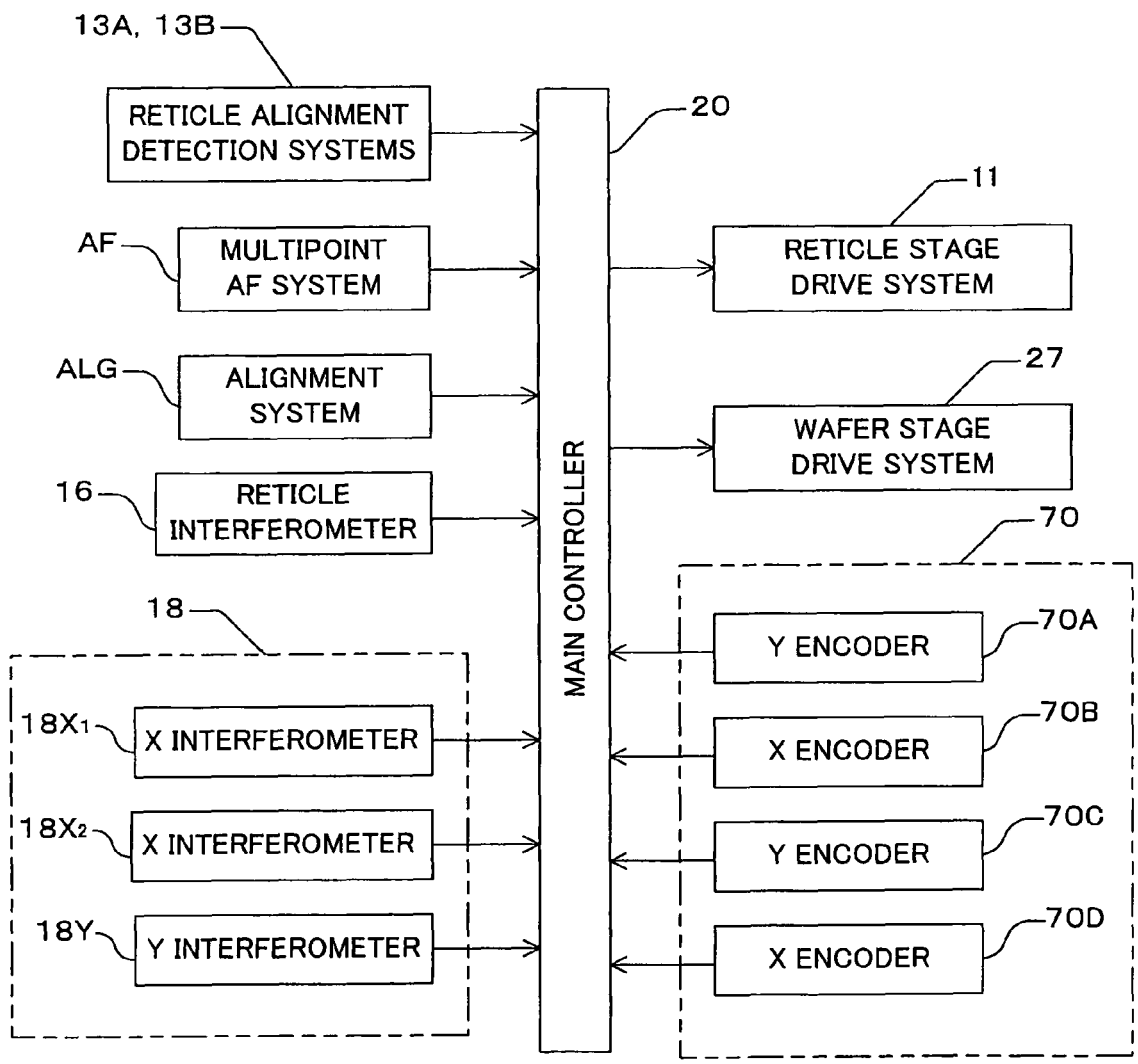
FIG. 5 is a block diagram showing a main configuration of a control system related to stage control in the exposure apparatus shown in FIG. 1.

In the embodiment, a magnitude and a direction of electric current supplied to respective coils 14a that constitute the coil unit are controlled by a main controller 20 shown in FIG. 5. Wafer stage drive system 27 shown in FIG. 5 is configured including planar motor 30 and the drive mechanism described earlier. Incidentally, planar motor 30 is not limited to a planar motor by a moving magnet method, but can be a planar motor by a moving coil method. Further, as planar motor 30, a planar motor by a magnetic levitation method can also be used. In this case, the air bearings described earlier do not have to be arranged.

On wafer table WTB, a wafer holder (not shown) is arranged within a circular recessed portion on its upper surface, and wafer W is mounted on the wafer holder. Wafer W is fixed to the wafer holder by, for example, vacuum suction (or electrostatic suction) with a chuck mechanism (not shown). In the embodiment, the surface of wafer W sucked on the wafer holder and at least the surface of an area around a wafer mounting area (substantially corresponding to the circular recessed portion), of the surface of wafer table WTB, are set to have substantially the same height. However, such a setting does not necessarily have to be made.

Further, a configuration is employed in which positional information of wafer stage WST within the XY plane can be measured with an encoder system 70 (not shown in FIG. 1, refer to FIG. 5). A configuration and the like of encoder system 70 are described in detail below.

As shown in a plan view of FIG. 2, on wafer stage WST, encoder heads (hereinafter, shortly referred to as heads, as needed) 60A, 60B, 60C and 60D are arranged at four corners, respectively. Of these encoder heads, a pair of heads 60A and 60C that are located on one of diagonal lines of wafer stage WST are heads with the Y-axis direction serving as their measurement directions. And, a pair of heads 60B and 60D that are located on the other diagonal line of wafer stage WST are heads with the X-axis direction serving as their measurement directions.

Figure 3:
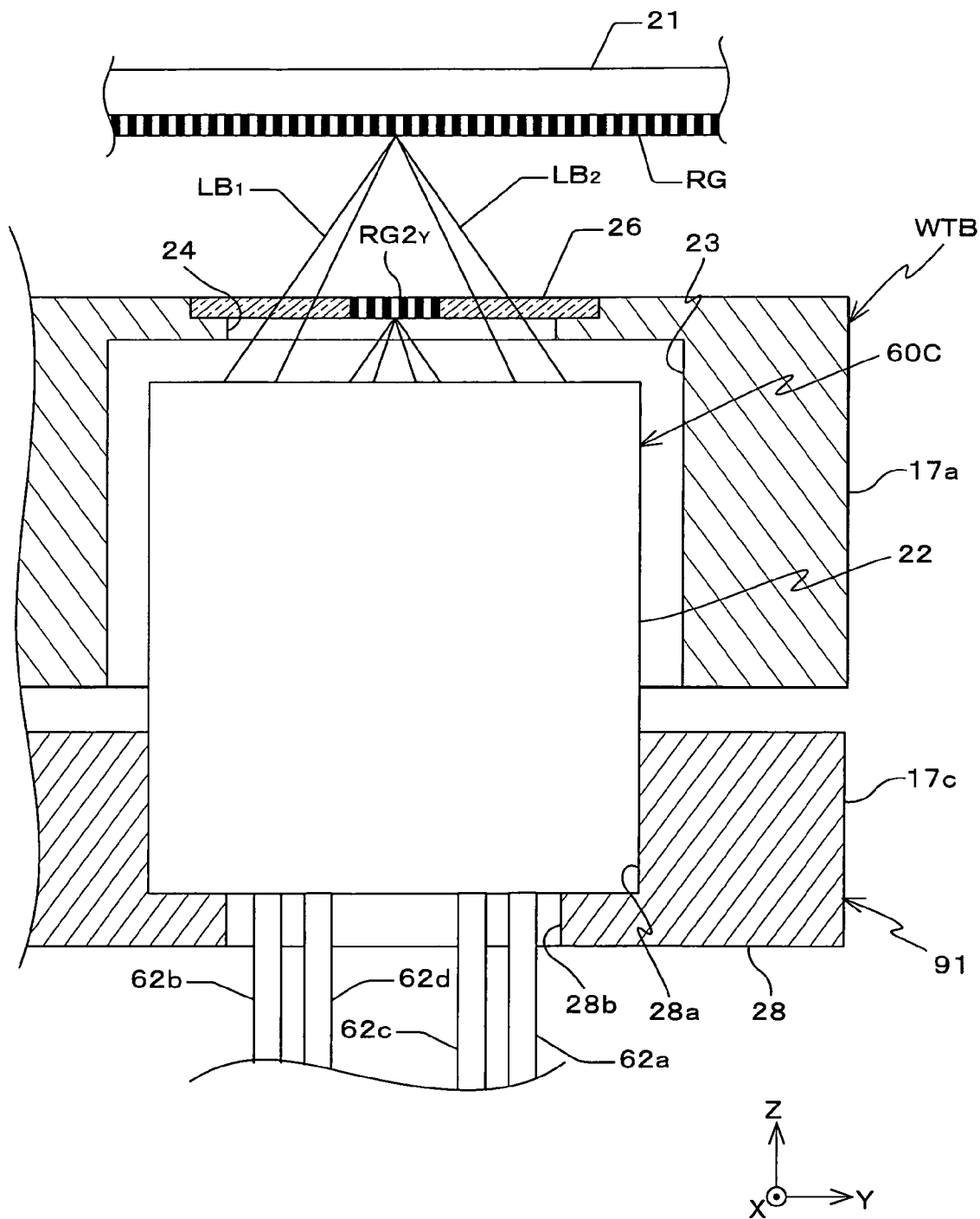
FIG. 3 is a view showing a partial cross section of a wafer stage shown in FIG. 1.

Now, the attachment state of heads 60A to 60D to wafer stage WST is described, focusing on head 60C as a representative, and referring to FIG. 3 which is a sectional view of wafer stage WST in the vicinity of head 60C.

As shown in FIG. 3, head 60C has a main section 22 having a rectangular parallelepiped shape (or a cylindrical shape) that houses an optical system (to be described later) inside thereof, and is fixed to a corner portion (an area near the corner) between a +X end and a +Y end on the upper surface of flange section 28 of coarse movement stage 91. That is, head 60C is fixed to a position facing the corner portion between the +X end and the +Y end of wafer table WTB. To be more specific, main section 22 of head 60C is inserted from above and fixed into a recessed section 28a with a rectangular shape (or circular shape) in a planar view having a predetermined depth, which is formed on the upper surface of flange section 28. Further, an upper portion of head 60C is inserted from below into a recessed section 23 with a rectangular shape (or circular shape) in a planar view that is slightly larger than recessed section 28a, which is formed on the lower surface of wafer table WTB. (More specifically, on the lower surface of wafer table WTB, four recessed sections 23 are formed near the four corners facing heads 60A, 60B, 60C and 60D, respectively, and wafer table WTB is supported in a noncontact manner above coarse movement stage 91 via a drive mechanism (not shown) in a state where heads 60A, 60B, 60C and 60D, except for a part of their lower ends, are respectively housed inside the respective recessed sections 23).

In this case, between the upper surface and the outer circumferential surface of main section 22 of head 60C, and wafer table WTB, a gap is formed that is enough to keep main section 22 from contacting with the inner wall surface of recessed section 23 even if wafer table WTB is maximally driven in any direction of directions of six degrees of freedom on coarse movement stage 91.

An opening 28b that vertically penetrates is formed in a center portion of the bottom wall of recessed section 28a of flange section 28, and four optical fibers 62a, 62b, 62c and 62d whose one ends are put inside main section 22 are put outside flange section 28 via opening 28b. The other ends of the four optical fibers 62a, 62b, 62c and 62d are attached near the lower end of coarse movement stage 91. Of these optical fibers, optical fibers 62b and 62d are fibers for receiving light and their other ends are optically connected, respectively, to a first photodetection system and a second photodetection system (not shown) respectively having a first photodetector and a second photodetector. And, optical fibers 62a and 62c are fibers for transmitting light and their other ends are optically connected, respectively, to a same light source (or two light sources that emit lights with a same wavelength). Incidentally, optical fibers 62a and 62c can be a same optical fiber branched in midstream, and in such a case, a light from a same light source can be split into two lights and the two lights can be respectively guided inside main section 22.

On an upper wall portion of recessed section 23 of wafer table WTB, an opening 24 that penetrates in a vertical direction and has a stepped section is formed. Inside opening 24, a grating plate 26 composed of a transparent member, e.g. a glass or the like is fixed in a state of being supported by the stepped section. In a center portion of grating plate 26 in the Y-axis direction, a reflective-type diffraction grating $RG2_Y$ with the Y-axis direction serving as its periodic direction is formed. In this case, a predetermined clearance is formed between the outer circumference of grating plate 26 and the inner wall surface of opening 24. This clearance is formed to prevent an unnecessary heat stress from acting on grating plate 26 in the case where grating plate 26 is thermally expanded. Further, the upper surface of grating plate 26 is set substantially flush with the upper surface of wafer table WTB. Incidentally, the surface where grating plate 26 is installed does not necessarily have to be coplanar with the upper surface of wafer table WTB in the Z-axis direction.

The remaining head 60A with the Y-axis direction serving as its measurement direction is configured similar to head 60C described above, and fixed to a corner portion between a −X end and a −Y end of flange section 28. Further, the respective constituting members near head 60A are also configured similar to those described above.

Further, a pair of heads 60B and 60D with the X-axis direction serving as their measurement directions are configured similar to head 60C described above, and fixed to a corner portion between the +X end and the −Y end and a corner portion between the −X end and the +Y end of flange section 28, respectively. Further, the respective constituting members near these heads are also configured similar to those described above. However, the periodic directions of diffraction gratings formed at grating plate 26 that face heads 60B and 60D are in the X-axis direction.

Figure 4:
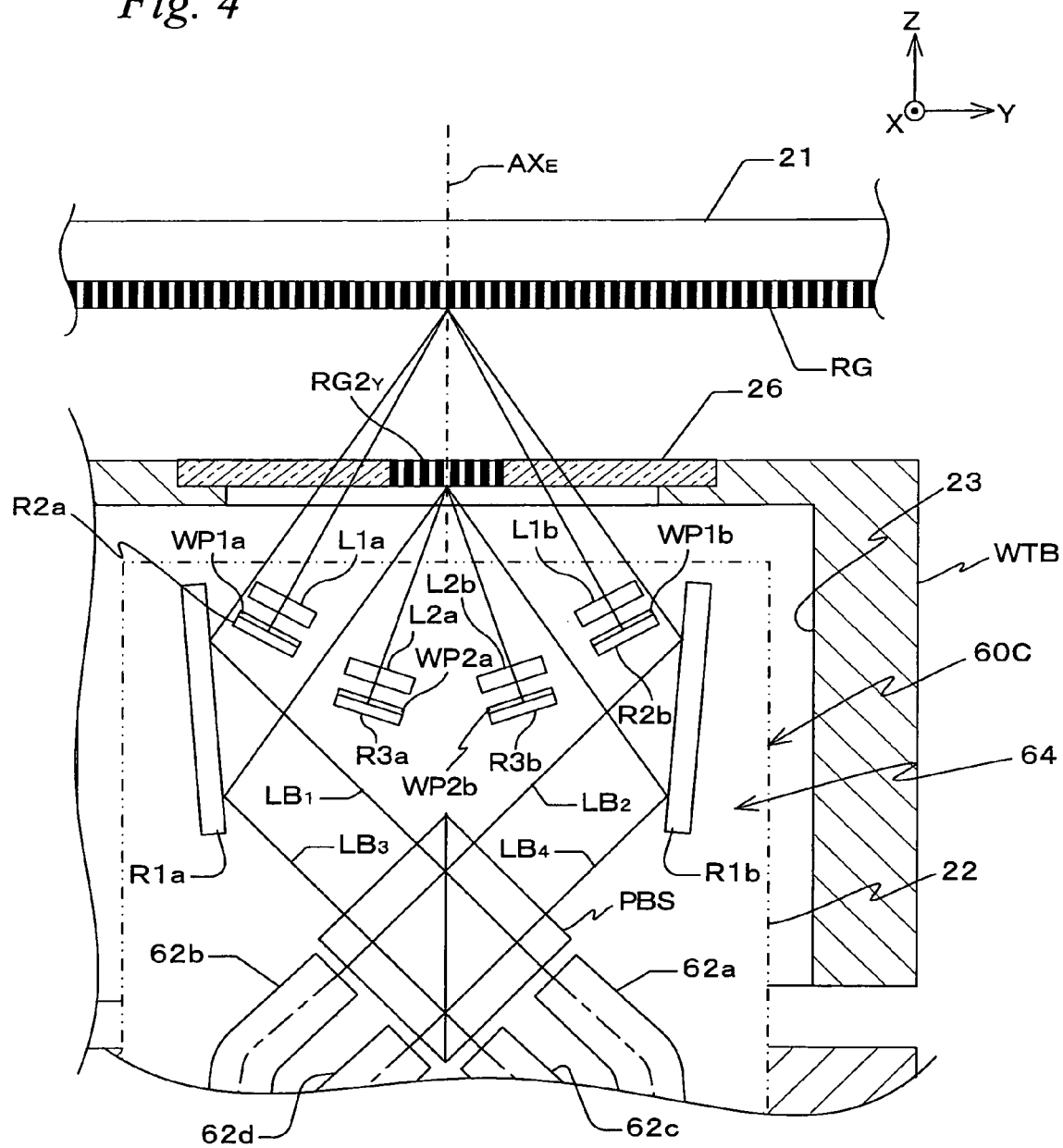
FIG. 4 is a view used to explain a configuration of an optical system in a main section of the encoder head.

Now, a schematic configuration and the like of the optical system inside head 60C are described referring to FIG. 4. Inside main section 22 of head 60C, for example, an optical system 64 is housed, which includes a polarization beam splitter PBS whose separation plane is parallel to an XZ plane, a pair of reflection mirrors R1a and R1b, a pair of lenses L1a and L1b and a pair of lenses L2a and L2b, a pair of quarter wavelength plates (hereinafter, referred to as λ/4 plates) WP1a and WP1b, and a pair of λ/4 plates WP2a and WP2b, a pair of reflection mirrors R2a and R2b and a pair of reflection mirrors R3a and R3b, and the like.

One end surfaces of optical fibers 62a and 62c are placed facing the incident surface of polarization beam splitter PBS, and one end surfaces of optical fibers 62b and 62d are placed facing the emitting surface of polarization beam splitter PBS.

In an encoder (hereinafter, referred to as a Y encoder 70C (refer to FIG. 5)) constituted by head 60C, laser beams LB (measurement lights) emitted from a light source arranged at coarse movement stage 91, e.g. a semiconductor laser or the like, enter polarization beam splitter PBS via optical fibers 62a and 62c respectively, and become measurement beams $LB_1$ and $LB_2$, and $LB_3$ and $LB_4$ by polarization split.

Measurement beam $LB_1$ transmitted through polarization beam splitter PBS reaches scale plate 21 via reflection mirror R1a, and measurement beam $LB_2$ reflected off polarization beam splitter PBS reaches scale plate 21 via reflection mirror R1b. Incidentally, "polarization split" in this case means the splitting of an incident beam into a P-polarization component and an S-polarization component.

Predetermined-order diffracted beams that are generated from diffraction grating RG due to irradiation of measurement beams $LB_1$ and $LB_2$, for example, the first-order diffracted beams are respectively converted into circular polarized lights by λ/4 plates WP1b and WP1a via lenses L1b and L1a, and then reflected by reflection mirrors R2b and R2a and pass through λ/4 plates WP1b and WP1a again and reach polarization beam splitter PBS by tracing the optical path, which is the same as the outward optical path, in the reversed direction.

Each of the polarization directions of the two beams that have reached polarization beam splitter PBS is rotated at an angle of 90 degrees with respect to the original direction. Therefore, the first-order diffracted beam of measurement beam $LB_1$ that was previously transmitted through polarization beam splitter PBS is reflected off polarization beam splitter PBS and enters the first photodetection system (not shown) via optical fiber 62b, and also the first-order diffracted beam of measurement beam $LB_2$ that was previously reflected off polarization beam splitter PBS is transmitted through polarization beam splitter PBS and is synthesized concentrically with the first-order diffracted beam of measurement beam $LB_1$ and enters the first photodetection system via optical fiber 62b.

Then, the polarization directions of the two first-order diffracted beams described above are uniformly arranged by, for example, an analyzer inside the first photodetection system and the beams interfere with each other to be an interference light, and the interference light is detected by the first photodetector, e.g. a photomultiplier tube or the like, and is converted into an electric signal in accordance with the intensity of the interference light.

Similarly, measurement beam $LB_3$ transmitted through polarization beam splitter PBS reaches grating plate 26 via reflection mirror R1a, and measurement beam $LB_4$ reflected off polarization beam splitter PBS reaches grating plate 26 via reflection mirror R1b.

Predetermined-order diffracted beams that are generated from diffraction grating $RG2_Y$ due to irradiation of measurement beams $LB_3$ and $LB_4$, for example, the first-order diffracted beams are respectively converted into circular polarized lights by λ/4 plates WP2b and WP2a via lenses L2b and L2$a$, and then reflected by reflection mirrors R3$b$ and R3$a$ and pass through λ/4 plates WP2$b$ and WP2$a$ again and reach polarization beam splitter PBS by tracing the optical path, which is the same as the outward optical path, in the reversed direction.

Each of the polarization directions of the two beams that have reached polarization beam splitter PBS is rotated at an angle of 90 degrees with respect to the original direction. Therefore, the first-order diffracted beam of measurement beam LB$_3$ that was previously transmitted through polarization beam splitter PBS is reflected off polarization beam splitter PBS and enters the second photodetection system (not shown) via optical fiber 62$d$, and also the first-order diffracted beam of measurement beam LB$_4$ that was previously reflected off polarization beam splitter PBS is transmitted through polarization beam splitter PBS and is synthesized concentrically with the first-order diffracted beam of measurement beam LB$_3$ and enters the second photodetection system via optical fiber 62$d$.

Then, the polarization directions of the two first-order diffracted beams described above are uniformly arranged by, for example, an analyzer inside the second photodetection system and the beams interfere with each other to be an interference light, and the interference light is detected by the second photodetector and is converted into an electric signal in accordance with the intensity of the interference light.

As can be seen from the above description, in Y encoder 70C (encoder head 60C), since the optical path lengths of measurement beams LB$_1$ and LB$_2$, and LB$_3$ and LB$_4$ in the air are short compared with an interferometer or the like, the influence by air fluctuations can mostly be ignored. And, by relative movement between head 60C and scale plate 21 due to movement of wafer stage WST and/or relative movement between wafer table WTB and coarse movement stage 91 (i.e. grating plate 26 and head 60C), in the measurement direction (in this case, the Y-axis direction), the phase of measurement beams LB$_1$ and LB$_2$ and/or measurement beams LB$_3$ and LB$_4$ changes and thus the intensity of the interference light changes. This change in the intensity of the interference light is detected by the first and second photodetection systems, respectively, and first positional information and second positional information in accordance with the intensity change are output from Y encoder 70C to main controller 20 (refer to FIG. 5). In this case, the first positional information is information that shows a relative position (a first positional relation) between coarse movement stage 91 and scale plate 21 in the Y-axis direction and the second positional information is information that shows a relative position (a second positional relation) between coarse movement stage 91 and grating plate 26 (wafer table WTB) in the Y-axis direction.

As is obvious from FIG. 4, in the embodiment, measurement beams LB$_1$ and LB$_2$, and measurement beams LB$_3$ and LB$_4$ are irradiated to diffraction gratings RG and RG2$_y$, respectively, along the optical paths that are symmetric with respect to a predetermined center axis AX$_E$ perpendicular to the lower surface (grating formation surface) of scale plate 21, i.e. parallel to the Z-axis. It is important for head 60C and the like that the optical paths of measurement beams LB$_1$ and LB$_2$ are bilaterally symmetric and the optical paths of measurement beams LB$_3$ and LB$_4$ are bilaterally symmetric. This is because if the symmetric property is lost, then measurement error occurs due to loss of the symmetric property. This point is disclosed in detail, for example, in International Publication No. 2008/026732 (the corresponding U.S. Patent Application Publication No. 2008/0106722) and the like. In the embodiment, measurement beams LB$_1$ and LB$_2$, and measurement beams LB$_3$ and LB$_4$ are irradiated from head 60C to diffraction gratings RG and RG2$_y$, respectively, along the symmetric optical paths that share center axis AX$_E$ described above, and therefore measurement beams LB$_1$ and LB$_2$ and the diffracted beams derived therefrom, and measurement beams LB$_3$ and LB$_4$ and the diffracted beams derived therefrom can share some of optical elements, e.g. reflection mirrors R1$a$ and R1$b$ and the like shown in FIG. 4, while maintaining the symmetric properties described above.

Head 60A has optical system 64 that is configured similar to that of head 60C, and irradiates scale plate 21 and grating plate 26 with one each pair of measurement beams, respectively, and based on the measurement principle similar to the one described above, head 60A outputs first positional information that shows a relative position between coarse movement stage 91 and scale plate 21 in the Y-axis direction and second positional information that shows a relative position between coarse movement stage 91 and grating plate 26 (wafer table WTB) in the Y-axis direction, to main controller 20. Hereinafter, an encoder that is configured by head 60A is referred to as a Y encoder 70A (refer to FIG. 5).

Although the remaining heads 60B and 60D have the measurement directions in the X-axis direction, heads 60B and 60D are configured similar to head 60C described above, and each of them outputs first positional information that shows a relative position between coarse movement stage 91 and scale plate 21 in the X-axis direction and second positional information that shows a relative position between coarse movement stage 91 and grating plate 26 (wafer table WTB) in the X-axis direction, to main controller 20, based on the similar measurement principle. Hereinafter, encoders that are configured by heads 60B and 60D are referred to as X encoders 70B and 70D (refer to FIG. 5).

Based on the first positional information and the second positional information from Y encoder 70C, main controller 20 computes the first positional relation between coarse movement stage 91 and scale plate 21 (diffraction grating RG) in the Y-axis direction and the second positional relation between coarse movement stage 91 and grating plate 26 (diffraction grating RG2$_y$, i.e. wafer table WTB) in the Y-axis direction, and can also compute a positional relation between wafer table WTB (wafer W) and scale plate 21 (diffraction grating RG) in the Y-axis direction, i.e. a position in the Y-axis direction (Y-position) Yc of wafer table WTB (wafer W), based on the first and second positional relations.

In a similar manner to the manner described above, based on the first positional information and the second positional information from Y encoder 70A, main controller 20 computes the first positional relation and the second positional relation described above, and can also compute a positional relation between wafer table WTB (wafer W) and scale plate 21 (diffraction grating RG) in the Y-axis direction, i.e. a position in the Y-axis direction (Y-position) Ya of wafer table WTB (wafer W), based on the first and second positional relations.

In a similar manner to the manner described above, based on the first positional information and the second positional information from each of X encoders 70B and 70D, main controller 20 can compute a positional relation between wafer table WTB (wafer W) and scale plate 21 (diffraction grating RG) in the X-axis direction, i.e. positions in the X-axis direction (X-positions) Xb and Xd of wafer table WTB (wafer W).

Then, when exposure or the like is performed, main controller 20 performs position control of wafer table WTB within the XY plane while computing the positions (i.e. the position in directions of three degrees of freedom, which are the X-axis direction, the Y-axis direction and the θz direction)

of wafer table WTB within the XY plane using at least three of Y positions Yc and Ya and X positions Xb and Xd described above.

Further, in each encoder of encoder system 70 in the embodiment, for example, when wafer table WTB is inclined with respect to the XY plane, the symmetric property of the optical paths of measurement beams $LB_3$ and $LB_4$ described earlier is lost, and measurement error occurs in the second positional information described earlier. And, for example, when coarse movement stage 91 is inclined with respect to the XY plane, the symmetric property of the optical paths of measurement beams $LB_3$ and $LB_4$ and the symmetric property of the optical paths of measurement beams $LB_1$ and $LB_2$ are lost, and measurement error occurs in the first positional information and the second positional information described earlier.

Therefore, a relation between inclination ($\theta x$ rotation, $\theta y$ rotation) of wafer table WTB with respect to the XY plane and measurement error included in the second positional information of each encoder, and a relation between inclination of coarse movement stage 91 with respect to the XY plane and measurement error included in the first and second positional information of each encoder are obtained in advance, and the obtained relations are stored in an internal memory of main controller 20 in a correction function or correction map format. Incidentally, each of the relations described above can be acquired by using a method similar to the acquisition method of correction information used to correct measurement error of each encoder caused by the relative motion between a head and a scale in a non-measurement direction, which is disclosed in, for example, the International Publication No. 2008/026732 (the corresponding U.S. Patent Application Publication No. 2008/0106722) described earlier and the like.

Further, in the embodiment, a configuration is employed in which the position of wafer stage WST can be measured with a wafer laser interferometer system (hereinafter, referred to as a "wafer interferometer system") 18 (refer to FIG. 5), independently from encoder system 70. Wafer stage WST has an X reflection surface and a Y reflection surface that are formed on end surfaces on one side (side surfaces) in the X-axis direction and the Y-axis direction, respectively, and wafer interferometer system 18 irradiates the X reflection surface and the Y reflection surface, respectively, with a plurality of laser beams (measurement beams), and thereby can measure the position of wafer stage WST in directions of five degrees of freedom (the X-axis direction, the Y-axis direction, the $\theta x$ direction, the $\theta y$ direction and the $\theta z$ direction).

The mirror-like finishing is applied to the +Y side surface (+Y end surface) and the −X side surface (−X end surface) of wafer table WTB, respectively, to form reflection surfaces 17a and 17b (refer to FIG. 2). And, the mirror-like finishing is applied to the +Y end surface and the −X end surface of flange section 28 of coarse movement stage 91, respectively, to form reflection surfaces 17c and 17d (refer to FIGS. 2 and 3).

Wafer interferometer system 18 is equipped with a Y interferometer 18Y that irradiates each of reflection surfaces 17a and 17c with a plurality of measurement beams parallel to the Y-axis direction, and an X interferometer that irradiates each of reflection surfaces 17b and 17d with a plurality of measurement beams parallel to the X-axis direction, and this X interferometer includes a plurality of, in this embodiment, two X interferometers $18X_1$ and $18X_2$ (refer to FIGS. 2 and 5).

A substantial measurement axis of Y interferometer 18Y in the Y-axis direction is a straight line in the Y-axis direction that passes through optical axis AX of projection optical system PL and the detection center of alignment system ALG (to be described later). Y interferometer 18Y measures positional information of wafer table WTB in the Y-axis direction, the $\theta z$ direction, and the $\theta x$ direction and positional information of coarse movement stage 91 in the $\theta x$ direction (and the Y-axis direction).

A substantial measurement axis of X interferometer $18X_1$ in the X-axis direction is a straight line in the X-axis direction that passes through optical axis AX of projection optical system PL. X interferometer $18X_1$ measures positional information of wafer table WTB in the X-axis direction and the $\theta y$ direction (and the $\theta z$ direction) and positional information of coarse movement stage 91 in the $\theta y$ direction (and the X-axis direction).

Further, a measurement axis of X interferometer $18X_2$ is a straight line in the X-axis direction that passes through the detection center of alignment system ALG. X interferometer $18X_2$ measures positional information of wafer table WTB in the X-axis direction and the $\theta y$ direction and positional information of coarse movement stage 91 in the $\theta y$ direction (and the X-axis direction).

Incidentally, for example, instead of reflection surfaces 17a and 17b described above, a movable mirror composed of a planar mirror can be attached to the ends of wafer table WTB. Further, a reflection surface inclined at an angle of 45 degrees with respect to the XY plane is arranged on wafer table WTB and the position of wafer table WTB in the Z-axis direction can be measured via the reflection surface.

The measurement values of the respective interferometers of wafer interferometer system 18 are supplied to main controller 20. In the embodiment, however, when controlling the position (including the $\theta z$ rotation) of wafer stage WST (wafer table WTB) within the XY plane, positional information measured by encoder system 70 described above is mainly used, and the measurement values of interferometers 18Y, $18X_1$ and $18X_2$ are secondarily used in the case where long-term variation of the measurement values (e.g. due to deformation of a scale caused by time passage) of encoder system 70 is corrected (calibrated), or for backup at the time of output abnormality of the encoder system. The positions of wafer table WTB in directions other than the X-axis direction, the Y-axis direction and the $\theta z$ direction, i.e. in the $\theta x$ direction and the $\theta y$ direction are measured with each interferometer of wafer interferometer system 18. Further, the $\theta x$ rotation and the $\theta y$ rotation of coarse movement stage 91 are measured with each interferometer of wafer interferometer system 18.

Alignment system ALG is placed a predetermined distance apart on the −Y side of projection optical system, as shown in FIGS. 1 and 2. In the embodiment, as alignment system ALG, an FIA (Field Image Alignment) system, which is a type of an alignment sensor by an image processing method that illuminates a mark with a broadband (wideband) light such as a halogen lamp and measures the mark position by performing image processing of an image of the mark, is used, as an example. Imaging signals from alignment system ALG are supplied to main controller 20 via an alignment signal processing system (not shown) (refer to FIG. 5).

Incidentally, alignment system ALG is not limited to the FIA system, and for example, an alignment sensor, which irradiates a subject mark with a coherent detection light and detects a scattered light or a diffracted light generated from the subject mark or makes two diffracted lights (e.g. diffracted lights of the same order or diffracted lights being diffracted in a same direction) generated from the subject mark interfere and detects an interference light, can naturally be used alone or in combination as needed.

In addition, in exposure apparatus 100 of the embodiment, in the vicinity of projection unit PU, a multipoint focal position detecting system (hereinafter, shortly referred to as a multipoint AF system) AF by an oblique incident method (not shown in FIG. 1, refer to FIG. 5) is arranged, which has a configuration similar to the one disclosed in, for example, U.S. Pat. No. 5,448,332 and the like. The detection signals of multipoint AF system AF are supplied to main controller 20 (refer to FIG. 5) via an AF signal processing system (not shown). Based on the detection signals of multipoint AF system AF, main controller 20 detects positional information of the surface of wafer W in the Z-axis direction at each detection point, and based on the detection results, executes so-called focus-leveling control of wafer W during scanning exposure. Incidentally, it is also possible that the multipoint AF system is arranged in the vicinity of alignment detection system ALG, and surface position information (unevenness information) of the wafer surface is acquired beforehand when performing wafer alignment, and then, when performing exposure, the so-called focus-leveling control of wafer W is executed using the surface position information and the measurement values of another sensor that detects the position of the upper surface of the wafer table in the Z-axis direction.

Moreover, in exposure apparatus 100, a pair of reticle alignment detection systems 13A and 13B (not shown in FIG. 1, refer to FIG. 5) by a TTR (Through The Reticle) method using a light with an exposure wavelength are arranged above reticle R. Detection signals of reticle alignment detection systems 13A and 13B are supplied to main controller 20 via an alignment signal processing system (not shown).

FIG. 5 shows a control system related to stage control of exposure apparatus 100 in a block diagram, although a part of the control system is omitted. The control system is mainly configured of main controller 20. Main controller 20 includes a so-called microcomputer (or workstation), which is composed of a CPU (Central Processing Unit), an ROM (Read Only Memory), an RAM (Random Access Memory), and the like, and performs overall control of the entire apparatus.

In exposure apparatus 100 having the configuration as described above, when manufacturing devices, reticle alignment and baseline measurement of alignment system ALG are performed in a procedure similar to the procedure of a conventional scanning stepper (e.g. the procedure disclosed in U.S. Pat. No. 5,646,413, and the like), by using reticle alignment systems 13A and 13B described above, the fiducial plate (not shown) on wafer table WTB, and the like, and before and after these operations, wafer alignment (such as the Enhanced Global Alignment (EGA), which is disclosed in U.S. Pat. No. 4,780,617, and the like), and the like are performed.

Then, main controller 20 performs an exposure operation by a step-and-scan method based on the measurement results of the baseline and the wafer alignment results, and patterns of reticle R are transferred respectively to a plurality of shot areas on wafer W. This exposure operation is performed by alternately repeating a scanning exposure operation of performing the synchronous movement of reticle stage RST and wafer stage WST described previously and an inter-shot movement (stepping) operation of moving wafer stage WST to an acceleration starting position for exposure of shot areas.

During the scanning exposure described above, main controller 20 measures positional information (including rotational information in the θz direction) of wafer table WTB (wafer stage WST) within the XY plane using encoder system 70, and also measures the θx rotation and the θy rotation of wafer table WTB and the θx rotation and the θy rotation of coarse movement stage 91 using X interferometer $18X_1$ and Y interferometer 18Y, and corrects the respective measurement values of at least three encoders of encoder system 70 based on the θx rotation and the θy rotation of wafer table WTB and the θx rotation and the θy rotation of coarse movement stage 91 and on the correction function or the correction map described earlier, and then, controls the position of wafer table WTB within the XY plane based on the respective measurement values of at least three encoders that have been corrected. Further, during the scanning exposure described above, main controller 20 executes the so-called focus-leveling control of wafer W, which adjusts a part of a shot area subject to exposure of wafer W (an area corresponding to exposure area IA) into the depth of focus of projection optical system PL by driving a drive mechanism (not shown) based on the measurement values of multipoint AF system AF. Therefore, wafer table WTB is driven in at least one of the Z-axis direction, the θx direction and the θz direction, during the focus-leveling control.

Consequently, according to exposure apparatus 100 of the embodiment, while executing the so-called focus-leveling control of wafer W, the position (including rotation in the θz direction) of wafer stage WST within the XY plane can be controlled with high precision based on measurement information of the respective encoders of encoder system 70.

Meanwhile, if the processing accuracy of the upper surface of stage base 12 and the performance of a plurality of air bearings of slider section 91a are increased to some extent, then movement of coarse movement stage 91 in the Z-axis direction, the θx direction and the θy direction is considered to become so small. In this case, measurement error included in the first and second positional information of the respective encoders, due to inclination of coarse movement stage 91 with respect to the XY plane, can be mostly ignored. In such a case, the inclination of coarse movement stage 91 does not have to be measured with wafer interferometer system 18. Further, in this case, even if wafer table WTB is inclined with respect to the XY plane, the symmetric property of the optical paths of measurement beams $LB_1$ and $LB_2$ of each encoder is not lost, and only the symmetric property of the optical paths of measurement beams $LB_3$ and $LB_4$ of each encoder is lost, but the optical path lengths of measurement beams $LB_3$ and $LB_4$ are shorter than those of measurement beams $LB_1$ and $LB_2$ and therefore the influence of inclination of the diffraction grating with respect to the head is lower. Accordingly, the measurement error of each encoder caused by the inclination of wafer table WTB with respect to the XY plane can be reduced.

As is described above, according to wafer stage device 50 related to the embodiment, a plurality of heads 60A to 60D that constitute encoder system 70 are arranged on coarse movement stage 91, and therefore the wiring or the like for supplying the electric power to heads 60A to 60D does not exist between coarse movement stage 91 and wafer table WTB. Accordingly, even if wafer table WTB is driven on coarse movement stage 91 by the drive mechanism in any direction of directions of six degrees of freedom, which are the X-axis direction, the Y-axis direction, the Z-axis direction, the θx direction, the θy direction and the θz direction, the movement of wafer table WTB is not blocked by a tensile force of the wiring or the like described above. Further, in the case where wafer table WTB moves on coarse movement stage 91 in a direction parallel to the XY plane, encoder system 70 measures positional information of wafer table WTB within the XY plane with high precision based on the outputs of one, or two or more head(s), of a plurality of heads 60A to 60D, which face(s) scale plate 21 (diffraction grating RG) and grating plate 26 (such as diffraction grating $RG2_Y$). Accordingly, the positional information of wafer table WTB within the XY plane can be measured with high precision without being affected by fine movement of wafer table WTB.

Further, in wafer stage device 50, even if wafer table WTB moves relative to coarse movement stage 91 in a range where wafer table WTB can move, any problems do not particularly occur in measurement by each head. Accordingly, there is no risk that the situation arises where position measurement of wafer table WTB or the like by encoder system 70 is adversely affected, e.g. measurement error occurs or measurement incapability occurs, due to the relative displacement between coarse movement stage 91 and wafer table WTB, and the like, caused by leveling and acceleration/deceleration of wafer table WTB.

Further, according to the embodiment, as is described previously, because the movement of wafer table WTB is not prevented by the tensile force of the wiring or the like, any problems do not particularly occur even if a plurality of encoder heads are attached to wafer stage WST. Accordingly, the positional information of wafer table WTB (wafer stage WST) within the XY plane can be measured with high precision without being affected by fine movement of wafer table WTB, and hence, it becomes possible to perform high-precision exposure to wafer W held on wafer table WTB by controlling the position of wafer table WTB (wafer stage WST) within the XY plane with high precision during the exposure. Further, since the light source and the photodetector which become heat source do not exist within the head, the influence of heat on wafer table WTB can be reduced.

Incidentally, in the embodiment above, a pair of measurement beams $LB_1$ and $LB_2$ and a pair of measurement beams $LB_3$ and $LB_4$ are separately irradiated from each head to scale plate 21 (diffraction grating RG) and grating plate 26 (e.g. diffraction grating $RG2_Y$). And, main controller 20 obtains the first positional relation between coarse movement stage 91 and scale plate 21 in the measurement direction based on the photoelectric conversion signal of the interference light of diffracted lights (return lights from diffraction grating RG) derived from measurement beams $LB_1$ and $LB_2$ respectively, and obtains the second positional relation between coarse movement stage 91 and grating plate 26 (wafer table WTB) in the measurement direction described above based on the photoelectric conversion signal of the interference light of diffracted lights (e.g. return lights from diffraction grating $RG2_Y$) derived from measurement beams $LB_3$ and $LB_4$ respectively, and further, computes a positional relation between wafer table WTB and scale plate 21 in the measurement direction described above based on the first and second positional relations. However, the present invention is not limited thereto.

More specifically, for example, a light-transmitting section through which a measurement beam from each encoder head can be transmitted, e.g. an opening section, a transparent section (e.g. grating plate 26 corresponds thereto), or the like only has to be arranged on at least a part of wafer table WTB (fine movement stage) so as to face one, or two or more encoder head(s) (an encoder system (measurement device) is configured including the encoder head(s)) fixed to coarse movement stage 91, and therefore, a grating (diffraction grating) does not necessarily have to be arranged. Also in such a case, positional information of wafer stage WST within the XY plane can be measured with high precision (e.g. hardly affected by air fluctuations), based on the output of at least one encoder head that irradiates scale plate 21 (diffraction grating RG) placed external to wafer stage WST (coarse/fine movement stage) so as to be substantially parallel to the XY plane with the measurement beams ($LB_1$, $LB_2$) via the light-transmitting section, and receives diffracted lights from scale plate 21 (diffraction grating RG) via the light-transmitting section. In this case, one, or two or more encoder head(s) is/are fixed to coarse movement stage 91, and therefore, even if the fine movement stage (wafer table WTB) is driven in any direction on the coarse movement stage, the movement of the fine movement stage is not blocked by the tensile force of the wiring or the like.

Further, in the above-described case, a sensor that measures a positional relation between coarse movement stage 91 and the fine movement stage (wafer table WTB) within the XY plane can be provided further. In this case, as the sensor, an encoder that includes an encoder head that irradiates a diffraction grating placed on the fine movement stage with a measurement beam can be used, as an example. In such a case, based on positional information of wafer stage WST, i.e. information on the positional relation between scale plate 21 and wafer stage WST within the XY plane, and on measurement information of the sensor described above, positional information of the fine movement stage within the XY plane can be obtained with high precision without being affected by fine movement of the fine movement stage (wafer table WTB), which is similar to the embodiment above, and hence, it becomes possible to control the position of the fine movement stage (coarse/fine movement stage) within the XY plane with high precision. Incidentally, in the sensor described above, the encoder head can be arranged on the fine movement stage, but the diffraction grating is preferably arranged on the fine movement stage. In this case, the position where the diffraction grating is arranged is not limited to the position in the embodiment above but can be an arbitrary position, and the sensor described above can be arranged separately from the encoders in the embodiment above, or a part of the encoder(s) in the embodiment above can be used as at least a part of the sensor. Further, the sensor described above can be a device other than the encoder, e.g. an interferometer or the like, and in such a case, the diffraction grating does not needed to be arranged on the fine movement stage.

Further, also in the case of arranging the light-transmitting section (grating plate 26) and the diffraction grating ($RG2_Y$) on wafer table WTB, which is similar to the embodiment above, by, for example, devising a configuration of the optical system inside main section 22, a configuration can be employed in which a pair of first measurement beams are irradiated to scale plate 21 and a pair of diffracted beams from diffraction grating RG that are derived from each of the first measurement beams, or a pair of diffracted beams derived from each of the pair of diffracted beams referred to earlier are irradiated, as a pair of second measurement beams, to grating plate 26 (e.g. diffraction grating $RG2_Y$), and a pair of diffracted beams from diffraction grating $RG2_Y$ derived from each of the second measurement beams are received by a photodetection system, and information equivalent to the difference between the first positional relation and the second positional relation described above is output as the output signal of the photodetection system. Or, a configuration can be employed in which a pair of first measurement beams are irradiated to grating plate 26 (e.g. diffraction grating $RG2_Y$), and a pair of diffracted beams from diffraction grating $RG2_Y$ derived from each of the first measurement beams, or a pair of diffracted beams derived from each of the pair of diffracted beams referred to earlier are irradiated, as a pair of second measurement beams, to scale plate 21, and a pair of diffracted beams from diffraction grating RG derived from each of the second measurement beams are received by a photodetection system, and information equivalent to the difference between the first positional relation and the second positional relation described above is output as the output signal of the photodetection system. The point is that the stage device and the exposure apparatus should be equipped with a measurement device which has one, or two or more encoder head(s) that irradiate(s) a first grating section placed substantially parallel to a predetermined plane (XY plane) and a second grating section arranged on a fine movement stage with first and second measurement beams respectively and receive(s) diffracted lights from each of the first and second grating sections is/are fixed to a coarse movement stage, and which measures positional information of the fine movement stage within the predetermined plane based on the output of at least one encoder head that faces the first and second grating sections, regardless of the configuration of the optical system inside the head.

Incidentally, the irradiation positions of the measurement beams in the measurement direction do not have to be the same between scale plate 21 and grating plate 26. More specifically, the optical axes of the measurement beams do not have to be in the same axis between scale plate 21 and grating plate 26.

Further, in the embodiment above, although the case has been described where encoder system 70 is equipped with a pair of X heads and a pair of Y heads, the present invention is not limited thereto. More specifically, the number of the encoder heads does not matter in particular, but encoder system 70 should have three encoder heads in total, which include at least one each of X head and Y head, in order to measure positional information (including the θz rotation) of wafer stage WST within the XY plane. Further, instead of the pair of X heads and the pair of Y heads described above, a two-dimensional head with directions of orthogonal two axes serving as its measurement directions can be used. In this case, if at least two two-dimensional heads are provided, then the positional information (including the θz rotation) of wafer stage WST within the XY plane can be measured. Alternatively, a sensor (or a head) that can measure the positional information in the Z-axis direction can be used together, or a sensor (or a head) that can measure the positional information in the X-axis direction and the Y-axis direction or a sensor (X sensor) with the X-axis direction serving as its measurement direction, and a sensor (Y sensor) with the Y-axis direction serving as its measurement direction can be used in combination. Further, in addition to a main sensor, a backup sensor can be arranged that is used for backup of the main sensor when output abnormality of the main sensor or the like occurs, or in the case where a plurality of groups of the main sensor and the backup sensor are provided, the grating on the fine movement stage can be shared by each of the groups.

Besides, an encoder, which can measure the positional information in at least one of the X-axis direction and Y-axis direction and in the Z-axis direction, can be used. In this case, similar to the previously-described case, positional information of the fine movement stage in the Z-axis direction can be obtained, based on first positional information of coarse movement stage 91 and scale plate 21 and second positional information of coarse movement stage 91 and the fine movement stage (wafer table WTB) obtained by another sensor, in the Z-axis direction.

Furthermore, in the embodiment above, the encoder is capable of measuring the positional information in at least one of the X-axis direction and the Y-axis direction, but this is not intended to be limiting, and it is also possible that the encoder is capable of measuring the positional information only in the Z-axis direction.

Further, in the embodiment above, the two-dimensional diffraction grating is formed on the lower surface of scale plate 21, but this is not intended to be limiting, and an X grating whose periodic direction is in the X-axis direction and a Y grating whose periodic direction is in the Y-axis direction can be formed in combination on the lower surface of scale plate 21 as far as their arrangement is in accordance with the movement route of the wafer stage (the movement route of each head). Further, scale plate 21 can be configured combining a plurality of scale plates. Or, it is also possible that a scale is only placed so that measurement by the encoder can be performed in at least the exposure operation and the alignment operation.

Further, for example, in the case of an exposure apparatus in which a projection optical system and an alignment system are placed apart, or the like, different scale plates can be separately placed near (on the periphery of) the projection optical system and near (on the periphery of) the alignment system. In this case, when performing an exposure operation of wafer W, the position of a wafer stage is measured with an encoder system by using the scale plate placed near the projection optical system, and when performing wafer alignment and the like, the position of the wafer stage is measured with the encoder system by using the scale plate placed near the alignment system.

Furthermore, in the embodiment above, although the case has been explained as an example where the wafer interferometer system is arranged in addition to the encoder system, the wafer interferometer system does not necessarily have to be arranged.

Further, in the embodiment above, the case has been described where the light source and the photodetection system (including the photodetector) are placed (at coarse movement stage 91) external to heads 60A to 60D, and between the light source and the photodetection system and each of heads 60A to 60D, lights (measurement lights) from the light source entering the encoder heads and lights returning from the encoder heads to the photodetection system are both guided using optical fibers 26a to 26d, but the present invention is not limited thereto. For example, in the case where each encoder head has a light source such as a semiconductor laser inside thereof, each encoder head and the photodetection system (including the photodetector) only has to be optically connected using optical fibers. Or, each encoder head may have the photodetection system (including the photodetector) inside thereof. In this case, if the light source is arranged external to the heads, light transmission of measurement lights from the light source via optical fibers is performed between the light source and the heads in a similar manner to the embodiment above.

Further, in the embodiment above, instead of the respective optical fibers described above, a relay optical system or another light-transmitting optical system can also be used. Furthermore, in the embodiment above, although the case has been explained as an example where the light source and the photodetection system (including the photodetector) that are optically connected to each of heads 60A to 60D via optical fibers 26a to 26d are placed at coarse movement stage 91, all of the light source and the photodetection system (including the photodetector) do not necessarily have to be placed at coarse movement stage 91.

Incidentally, in the embodiment above, the case has been described where the present invention is applied to the scanning stepper, but this is not intended to be limiting, and the present invention can also be applied to a static exposure apparatus such as a stepper. Even with the stepper, by measuring the position of a stage on which an object that is subject to exposure is mounted using an encoder, occurrence of position measurement error caused by air fluctuations can be reduced to almost zero, which is unlike the case when the position of the stage is measured using an interferometer, and therefore the position of the stage can be set with high precision based on the measurement values of the encoder, which consequently makes it possible to transfer a reticle pattern onto the object with high precision. Further, the present invention can also be applied to a reduction projection exposure apparatus by a step-and-stitch method that synthesizes a shot area and a shot area.

Further, the magnification of the projection optical system in the exposure apparatus of the embodiment above is not only a reduction system, but also can be either an equal magnifying system or a magnifying system, and projection optical system PL is not only a dioptric system, but also can be either a catoptric system or a catadioptric system, and in addition, the projected image can be either an inverted image or an upright image.

Further, illumination light IL is not limited to the ArF excimer laser light (wavelength: 193 nm), but can be an ultraviolet light such as a KrF excimer laser light (wavelength: 248 nm), or a vacuum ultraviolet light such as an $F_2$ laser light (wavelength: 157 nm). As is disclosed in, for example, U.S. Pat. No. 7,023,610, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytterbium), and by converting the wavelength into ultraviolet light using a nonlinear optical crystal, can also be used.

Further, in the embodiment above, illumination light IL of the exposure apparatus is not limited to the light having a wavelength more than or equal to 100 nm, and it is needless to say that the light having a wavelength less than 100 nm can be used. For example, the present invention can also be applied to an EUV (Extreme Ultraviolet) exposure apparatus that uses an EUV light in a soft X-ray range (e.g. a wavelength range from 5 to 15 nm). Besides such an apparatus, the present invention can also be applied to an exposure apparatus that uses charged particle beams such as an electron beam or an ion beam. Furthermore, the present invention can also be applied to a liquid immersion type exposure apparatus in which the space between a projection optical system and a wafer is filled with liquid, which is disclosed in, for example, U.S. Patent Application Publication No. 2005/0259234 and the like. The configuration of each encoder head that is equipped in wafer stage device 50 of the embodiment above is also suitable for the liquid immersion type exposure apparatus. Since an opening formed on the upper surface of wafer table WTB is closed with a grating plate made up of a glass or the like at substantially the same height as the upper surface of wafer table WTB, inconvenience such as liquid leakage hardly occurs even if the liquid that forms a liquid immersion area is located above the head.

Further, in the embodiment above, a transmissive type mask (reticle), which is a transmissive substrate on which a predetermined light shielding pattern (or a phase pattern or a light attenuation pattern) is formed, is used. Instead of this reticle, however, as is disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used. In the case of using such a variable shaped mask, a stage on which a wafer, a glass plate or the like is mounted is scanned relative to the variable shaped mask, and therefore the equivalent effect to the embodiment above can be obtained by measuring the position of the stage using an encoder.

Further, as is disclosed in, for example, International Publication No. 2001/035168, the present invention can also be applied to an exposure apparatus (lithography system) that forms line-and-space patterns on wafer W by forming interference fringes on wafer W.

Moreover, the present invention can also be applied to an exposure apparatus that synthesizes two reticle patterns on a wafer via a projection optical system and almost simultaneously performs double exposure of one shot area on the wafer by one scanning exposure, as is disclosed in, for example, U.S. Pat. No. 6,611,316.

Further, an apparatus that forms a pattern on an object is not limited to the exposure apparatus (lithography system) described previously, and for example, the present invention can also be applied to an apparatus that forms a pattern on an object by an ink-jet method.

Incidentally, an object on which a pattern is to be formed (an object subject to exposure to which an energy beam is irradiated) in the embodiment above is not limited to a wafer, but can be another object such as a glass plate, a ceramic substrate, a film member, or a mask blank.

The use of the exposure apparatus is not limited to the exposure apparatus for manufacturing semiconductor devices, but the present invention can also be widely applied, for example, to an exposure apparatus for liquid crystal display devices that transfers a liquid crystal display device pattern onto a rectangular glass plate, and an exposure apparatus for producing organic ELs, thin-film magnetic heads, imaging devices (such as CCDs), micromachines, DNA chips, and the like. Further, the present invention can be applied not only to an exposure apparatus for producing microdevices such as semiconductor devices, but can also be applied to an exposure apparatus that transfers a circuit pattern onto a glass substrate, a silicon wafer or the like to produce a reticle or a mask used in a light exposure apparatus, an EUV exposure apparatus, an X-ray exposure apparatus, an electron-beam exposure apparatus, and the like.

Incidentally, the stage device of the present invention can be applied not only to the exposure apparatus, but can also be applied widely to other substrate processing apparatuses (such as a laser repair apparatus, a substrate inspection apparatus and the like), or to a position setting apparatus of a sample or a wire bonding apparatus in other precision machines.

Incidentally, the above disclosures of all the publications (including the International Publications), and specifications of the U.S. Patent Application Publications and the U.S. Patents that are cited in the description above and related to exposure apparatuses and the like are each incorporated herein by reference.

Incidentally, semiconductor devices are manufactured through the following steps: a step where the function/performance design of a device is performed, a step where a reticle is manufactured based on this design step; a step where a wafer is manufactured from silicon materials; a lithography step where a pattern formed on the mask is transferred onto an object such as the wafer by the exposure apparatus of the embodiment above; a development step where the exposed wafer (object) is developed; an etching step where an exposed member of an area other than the area where resist remains is removed by etching; a resist removing step where the resist that is no longer necessary when the etching is completed is removed; a device assembly step (including a dicing process, a bonding process, and a packaging process); an inspection step; and the like. In this case, since the exposure apparatus of the embodiment above is used in the lithography step, the devices with high integration can be manufactured with good yield.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A stage device, comprising:
    a coarse/fine movement stage including a coarse movement stage that moves along a predetermined plane and a fine movement stage that is finely movable on the coarse movement stage; and
    a measurement device that has an encoder head arranged on the coarse movement stage, and measures positional information of the fine movement stage in a predetermined direction, based on first positional information obtained by irradiating a first grating section placed external to the coarse/fine movement stage so as to be substantially parallel to the predetermined plane with a first measurement beam and receiving a diffracted light from the first grating section and on second positional information that is relative positional information between the coarse movement stage and the fine movement stage,
    wherein the measurement device acquires the second positional information between the coarse movement stage and the fine movement stage with the encoder head.

2. The stage device according to claim 1, wherein
    the measurement device obtains the second positional information by irradiating a second grating section arranged on the fine movement stage with a second measurement beam and receiving a diffracted light from the second grating section, by using the encoder head.

3. The stage device according to claim 1, wherein
    the measurement device irradiates the first grating section with the first measurement beam via a light-transmitting section arranged on the fine movement stage.

4. The stage device according to claim 3, wherein
    a plurality of the encoder heads are fixed to different positions on the coarse movement stage, and the fine movement stage has the light-transmitting section in an area that faces each of the plurality of the encoder heads.

5. The stage device according to claim 4, wherein
    on the fine movement stage, a second grating section is arranged at a position that faces each of the plurality of the encoder heads,
    each of the plurality of the encoder heads irradiates the second grating section that faces each of the encoder heads with a second measurement beam and receives also a diffracted light from the second grating section, and
    the measurement device measures positional information of the fine movement stage within the predetermined plane based on an output of at least one of the encoder heads.

6. The stage device according to claim 5, wherein
    the first measurement beam and the second measurement beam are light beams generated from a same light source.

7. The stage device according to claim 6, wherein
    one measurement beam of the first measurement beam and the second measurement beam is generated by extracting at least a part of a diffracted beam within the encoder head, the diffracted beam being diffracted at the grating section to which the other measurement beam corresponds.

8. The stage device according to claim 5, wherein
    each of the plurality of the encoder heads irradiates the first and second grating sections with the first and second measurement beams respectively, along optical paths that share a predetermined center axis perpendicular to the first grating section.

9. The stage device according to claim 5, wherein
    the measurement device computes a first positional relation between the coarse movement stage and the first grating section in a measurement direction parallel to the predetermined plane and a second positional relation between the coarse movement stage and the second grating section in the measurement direction based on an output from each of the plurality of the encoder heads, and also computes a positional relation between the fine movement stage and the first grating section in the measurement direction based on the first and second positional relations.

10. The stage device according to claim 5, wherein
    the fine movement stage is movable in an inclination direction with respect to the predetermined plane, and
    the measurement device corrects a measurement error of the encoder head that is used for measurement of positional information of the fine movement stage, the measurement error being caused by inclination of the fine movement stage.

11. The stage device according to claim 4, wherein
    the fine movement stage is composed of a member having a rectangular shape in a planar view, and the encoder heads are respectively placed at positions on the coarse movement stage that correspond to four corner portions of the fine movement stage.

12. The stage device according to claim 4, wherein
    the measurement device corrects a measurement error of the encoder head that is used for measurement of positional information of the coarse/fine movement stage, the measurement error being caused by inclination of the coarse movement stage with respect to the predetermined plane.

13. The stage device according to claim 4, further comprising:
    a sensor that measures a positional relation between the coarse movement stage and the fine movement stage within the predetermined plane.

14. The stage device according to claim 1, wherein
    the measurement device measures positional information of the fine movement stage in at least one direction parallel to the predetermined plane.

15. The stage device according to claim 1, wherein
    the measurement device has a plurality of the encoder heads placed at different positions on the coarse movement stage, and measures positional information of the fine movement stage in at least directions of three degrees of freedom within the predetermined plane.

16. The stage device according to claim 15, wherein
the fine movement stage is movable in an inclination direction with respect to the predetermined plane, and
the measurement device corrects a measurement error of the encoder head that is used for measurement of positional information of the fine movement stage, the measurement error being caused by inclination of the fine movement stage.

17. The stage device according to claim 15, wherein
the fine movement stage is composed of a member having a rectangular shape in a planar view, and the encoder heads are respectively placed at positions on the coarse movement stage that correspond to four corner portions of the fine movement stage.

18. The stage device according to claim 1, wherein
the first grating section includes a two-dimensional grating that covers a movement range of the coarse/fine movement stage.

19. The stage device according to claim 1, wherein
the fine movement stage is supported by the coarse movement stage in a noncontact manner.

20. A pattern formation apparatus that forms a pattern on an object, the apparatus comprising:
the stage device according to claim 1, in which the object is mounted on the fine movement stage; and
a patterning device that generates a pattern on the object mounted on the fine movement stage.

21. The pattern formation apparatus according to claim 20, wherein
the object has a sensitive layer, and the patterning device generates the pattern on the object by exposing the sensitive layer with irradiation of an energy beam.

22. An exposure apparatus that forms a pattern on an object with irradiation of an energy beam, the apparatus comprising:
the stage device according to claim 1, in which the object is mounted on the fine movement stage; and
a patterning device that irradiates the object mounted on the fine movement stage with the energy beam.

23. A device manufacturing method, comprising:
exposing an object using the exposure apparatus according to claim 22; and
developing the object that has been exposed.

24. A stage device, comprising:
a coarse/fine movement stage including a coarse movement stage that moves along a predetermined plane and a fine movement stage that is finely movable on the coarse movement stage; and
a measurement device that has an encoder head arranged on the coarse movement stage, and measures positional information of the fine movement stage in a predetermined direction by irradiating a first grating section placed external to the coarse/fine movement stage so as to be substantially parallel to the predetermined plane and a second grating section placed on the fine movement stage and positioned to a first grating side of the encoder head with a first measurement beam and a second measurement beam from the encoder head, respectively, and receiving diffracted lights from the first and second grating sections.

25. The stage device according to claim 24, wherein
the measurement device irradiates the first grating section with the first measurement beam via a light-transmitting section arranged on the fine movement stage.

26. The stage device according to claim 25, wherein
a plurality of the encoder heads are fixed to different positions on the coarse movement stage, and the fine movement stage has the light-transmitting section in an area that faces each of the plurality of the encoder heads.

27. The stage device according to claim 26, wherein
on the fine movement stage, a second grating section is arranged at a position that faces each of the plurality of the encoder heads,
each of the plurality of the encoder heads irradiates the second grating section that faces each of the encoder heads with a second measurement beam and receives also a diffracted light from the second grating section, and
the measurement device measures positional information of the fine movement stage within the predetermined plane based on an output of at least one of the encoder heads.

28. The stage device according to claim 27, wherein
the fine movement stage is movable in an inclination direction with respect to the predetermined plane, and
the measurement device corrects a measurement error of the encoder head that is used for measurement of positional information of the fine movement stage, the measurement error being caused by inclination of the fine movement stage.

29. The stage device according to claim 26, wherein
the fine movement stage is composed of a member having a rectangular shape in a planar view, and the encoder heads are respectively placed at positions on the coarse movement stage that correspond to four corner portions of the fine movement stage.

30. The stage device according to claim 26, wherein
the measurement device corrects a measurement error of the encoder head that is used for measurement of positional information of the coarse/fine movement stage, the measurement error being caused by inclination of the coarse movement stage with respect to the predetermined plane.

31. The stage device according to claim 26, further comprising:
a sensor that measures a positional relation between the coarse movement stage and the fine movement stage within the predetermined plane.

32. The stage device according to claim 24, wherein
the measurement device measures positional information of the fine movement stage in at least one direction parallel to the predetermined plane.

33. The stage device according to claim 24, wherein
the measurement device has a plurality of the encoder heads placed at different positions on the coarse movement stage, and measures positional information of the fine movement stage in at least directions of three degrees of freedom within the predetermined plane.

34. The stage device according to claim 33, wherein
the fine movement stage is movable in an inclination direction with respect to the predetermined plane, and
the measurement device corrects a measurement error of the encoder head that is used for measurement of positional information of the fine movement stage, the measurement error being caused by inclination of the fine movement stage.

35. The stage device according to claim 33, wherein
the fine movement stage is composed of a member having a rectangular shape in a planar view, and the encoder heads are respectively placed at positions on the coarse movement stage that correspond to four corner portions of the fine movement stage.

36. The stage device according to claim 24, wherein
the first measurement beam and the second measurement beam are light beams generated from a same light source.

37. The stage device according to claim 36, wherein
one measurement beam of the first measurement beam and the second measurement beam is generated by extracting at least a part of a diffracted beam within the encoder head, the diffracted beam being diffracted at the grating section to which the other measurement beam corresponds.

38. The stage device according to claim 36, wherein
each of the plurality of the encoder heads irradiates the first and second grating sections with the first and second measurement beams respectively, along optical paths that share a predetermined center axis perpendicular to the first grating section.

39. The stage device according to claim 36, wherein
the measurement device computes a first positional relation between the coarse movement stage and the first grating section in a measurement direction parallel to the predetermined plane and a second positional relation between the coarse movement stage and the second grating section in the measurement direction based on an output from each of the plurality of the encoder heads, and also computes a positional relation between the fine movement stage and the first grating section in the measurement direction based on the first and second positional relations.

40. The stage device according to claim 36, wherein
the fine movement stage is movable in an inclination direction with respect to the predetermined plane, and
the measurement device corrects a measurement error of the encoder head that is used for measurement of positional information of the fine movement stage, the measurement error being caused by inclination of the fine movement stage.

41. The stage device according to claim 36, wherein
the fine movement stage is composed of a member having a rectangular shape in a planar view, and the encoder heads are respectively placed at positions on the coarse movement stage that correspond to four corner portions of the fine movement stage.

42. The stage device according to claim 36, wherein
the measurement device corrects a measurement error of the encoder head that is used for measurement of positional information of the coarse/fine movement stage, the measurement error being caused by inclination of the coarse movement stage with respect to the predetermined plane.

43. The stage device according to claim 24, wherein
the first grating section includes a two-dimensional grating that covers a movement range of the coarse/fine movement stage.

44. The stage device according to claim 24, wherein
the fine movement stage is supported by the coarse movement stage in a noncontact manner.

45. A pattern formation apparatus that forms a pattern on an object, the apparatus comprising:
the stage device according to claim 24, in which the object is mounted on the fine movement stage; and
a patterning device that generates a pattern on the object mounted on the fine movement stage.

46. The pattern formation apparatus according to claim 45, wherein
the object has a sensitive layer, and the patterning device generates the pattern on the object by exposing the sensitive layer with irradiation of an energy beam.

47. An exposure apparatus that forms a pattern on an object with irradiation of an energy beam, the apparatus comprising:
the stage device according to claim 24, in which the object is mounted on the fine movement stage; and
a patterning device that irradiates the object mounted on the fine movement stage with the energy beam.

48. A device manufacturing method, comprising:
exposing an object using the exposure apparatus according to claim 47; and
developing the object that has been exposed.

49. A stage device, comprising:
a coarse/fine movement stage including a coarse movement stage that moves along a predetermined plane and a fine movement stage that is finely movable on the coarse movement stage and has a light-transmitting section in at least a part thereof; and
a measurement device that has one encoder head or two or more encoder heads fixed to the coarse movement stage, and measures positional information of the coarse/fine movement stage within the predetermined plane based on an output of at least one of the encoder heads that irradiates a first grating section placed external to the coarse/fine movement stage so as to be substantially parallel to the predetermined plan, with a first measurement beam via the light-transmitting section, and receives a diffracted light from the first grating section via the light-transmitting section,
wherein a plurality of the encoder heads are fixed to different positions on the coarse movement stage, and the fine movement stage has the light-transmitting section in an area that faces each of the plurality of the encoder heads.

50. The stage device according to claim 49, wherein
on the fine movement stage, a second grating section is arranged at a position that faces each of the plurality of the encoder heads,
each of the plurality of the encoder heads irradiates the second grating section that faces each of the encoder heads with a second measurement beam and receives also a diffracted light from the second grating section, and
the measurement device measures positional information of the fine movement stage within the predetermined plane based on an output of at least one of the encoder heads.

51. The stage device according to claim 50, wherein
the first measurement beam and the second measurement beam are light beams generated from a same light source.

52. The stage device according to claim 51, wherein
one measurement beam of the first measurement beam and the second measurement beam is generated by extracting at least a part of a diffracted beam within the encoder head, the diffracted beam being diffracted at the grating section to which the other measurement beam corresponds.

53. The stage device according to claim 50, wherein
each of the plurality of the encoder heads irradiates the first and second grating sections with the first and second measurement beams respectively, along optical paths that share a predetermined center axis perpendicular to the first grating section.

54. The stage device according to claim 50, wherein
the measurement device computes a first positional relation between the coarse movement stage and the first grating section in a measurement direction parallel to the predetermined plane and a second positional relation between the coarse movement stage and the second grating section in the measurement direction based on an output from each of the plurality of the encoder heads, and also computes a positional relation between the fine movement stage and the first grating section in the measurement direction based on the first and second positional relations.

55. The stage device according to claim 50, wherein
the fine movement stage is movable in an inclination direction with respect to the predetermined plane, and
the measurement device corrects a measurement error of the encoder head that is used for measurement of positional information of the fine movement stage, the measurement error being caused by inclination of the fine movement stage.

56. The stage device according to claim 49, wherein
the fine movement stage is composed of a member having a rectangular shape in a planar view, and the encoder heads are respectively placed at positions on the coarse movement stage that correspond to four corner portions of the fine movement stage.

57. The stage device according to claim 49, wherein
the measurement device corrects a measurement error of the encoder head that is used for measurement of positional information of the coarse/fine movement stage, the measurement error being caused by inclination of the coarse movement stage with respect to the predetermined plane.

58. The stage device according to claim 49, further comprising:
a sensor that measures a positional relation between the coarse movement stage and the fine movement stage within the predetermined plane.

59. The stage device according to claim 49, wherein
the first grating section includes a two-dimensional grating that covers a movement range of the coarse/fine movement stage.

60. The stage device according to claim 49, wherein
the fine movement stage is supported by the coarse movement stage in a noncontact manner.

61. A pattern formation apparatus that forms a pattern on an object, the apparatus comprising:
the stage device according to claim 49, in which the object is mounted on the fine movement stage; and
a patterning device that generates a pattern on the object mounted on the fine movement stage.

62. The pattern formation apparatus according to claim 61, wherein
the object has a sensitive layer, and the patterning device generates the pattern on the object by exposing the sensitive layer with irradiation of an energy beam.

63. An exposure apparatus that forms a pattern on an object with irradiation of an energy beam, the apparatus comprising:
the stage device according to claim 49, in which the object is mounted on the fine movement stage; and
a patterning device that irradiates the object mounted on the fine movement stage with the energy beam.

64. A device manufacturing method, comprising:
exposing an object using the exposure apparatus according to claim 63; and
developing the object that has been exposed.

65. A stage drive method of driving a coarse/fine movement stage that has a coarse movement stage that moves along a predetermined plane and a fine movement stage that is finely movable on the coarse movement stage, the method comprising:
measuring positional information of the fine movement stage in a predetermined direction, based on first positional information obtained from an output of an encoder head arranged on the coarse movement stage that irradiates a first grating section placed external to the coarse/fine movement stage so as to be substantially parallel to the predetermined plane with a first measurement beam and receives a diffracted light from the first grating section, and on second positional information that is relative positional information between the coarse movement stage and the fine movement stage,
wherein, in the measuring, the second positional information between the coarse movement stage and the fine movement stage is acquired with the encoder head.

66. The stage drive method according to claim 65, wherein
the encoder head obtains the second positional information by irradiating a second grating section arranged on the fine movement stage with a second measurement beam and receiving a diffracted light from the second grating section.

67. The stage drive method according to claim 65, wherein
the encoder head irradiates the first grating section with the first measurement beam via a light-transmitting section arranged on the fine movement stage.

68. The stage drive method according to claim 65, wherein
in the measuring, positional information of the fine movement stage in at least one direction parallel to the predetermined plane is measured.

69. The stage drive method according to claim 65, wherein
a plurality of the encoder heads are placed at different positions on the coarse movement stage, and
in the measuring, positional information of the fine movement stage in at least directions of three degrees of freedom within the predetermined plane is measured.

70. An exposure method of forming a pattern on an object with irradiation of an energy beam, the method comprising:
driving a coarse/fine movement stage in which the object is mounted on the fine movement stage, by using the stage drive method according to claim 65.

71. A device manufacturing method, comprising:
exposing an object using the exposure method according to claim 70; and
developing the object that has been exposed.

72. A stage drive method of driving a coarse/fine movement stage that has a coarse movement stage that moves along a predetermined plane and a fine movement stage that is finely movable on the coarse movement stage, the method comprising:
measuring positional information of the fine movement stage in a predetermined direction, based on an output of an encoder head arranged on the coarse movement stage that irradiates a first grating section placed external to the coarse/fine movement stage so as to be substantially parallel to the predetermined plane and a second grating section placed on the fine movement stage and positioned to a first grating side of the encoder head with a first measurement beam and a second measurement beam from the encoder head, respectively, and receives diffracted lights from the first and second grating sections.

73. The stage drive method according to claim 72, wherein the encoder head irradiates the first grating section with the first measurement beam via a light-transmitting section arranged on the fine movement stage.

74. The stage drive method according to claim 72, wherein in the measuring, positional information of the fine movement stage in at least one direction parallel to the predetermined plane is measured.

75. The stage drive method according to claim 72, wherein a plurality of the encoder heads are placed at different positions on the coarse movement stage, and
in the measuring, positional information of the fine movement stage in at least directions of three degrees of freedom within the predetermined plane is measured.

76. The stage drive method according to claim 72, wherein the first measurement beam and the second measurement beam are light beams generated from a same light source.

77. The stage drive method according to claim 76 wherein one measurement beam of the first measurement beam and the second measurement beam is generated by extracting at least a part of a diffracted beam within the encoder head, the diffracted beam being diffracted at the grating section to which the other measurement beam corresponds.

78. The stage drive method according to claim 76, wherein in the measuring, a first positional relation between the coarse movement stage and the first grating section in a measurement direction parallel to the predetermined plane and a second positional relation between the coarse movement stage and the second grating section in the measurement direction are computed based on an output from each of a plurality of the encoder heads, and also a positional relation between the fine movement stage and the first grating section in the measurement direction is computed based on the first and second positional relations.

79. The stage drive method according to claim 76, wherein in the measuring, a measurement error of the encoder head that is used for measurement of positional information of the fine movement stage is corrected, the measurement error being caused by inclination of the fine movement stage.

80. The stage drive method according to claim 76, wherein in the measuring, a measurement error of the encoder head that is used for measurement of positional information of the coarse/fine movement stage is corrected, the measurement error being caused by inclination of the coarse movement stage with respect to the predetermined plane.

81. An exposure method of forming a pattern on an object with irradiation of an energy beam, the method comprising:
driving a coarse/fine movement stage in which the object is mounted on the fine movement stage, by using the stage drive method according to claim 72.

82. A device manufacturing method, comprising:
exposing an object using the exposure method according to claim 81; and
developing the object that has been exposed.

83. A stage drive method of driving a coarse/fine movement stage that has a coarse movement stage that moves along a predetermined plane and a fine movement stage that is finely movable on the coarse movement stage, the method comprising:
measuring positional information of the coarse/fine movement stage within the predetermined plane, based on an output of at least one encoder head, from among one encoder head or two or more encoder heads fixed to the coarse movement stage, which irradiates a first grating section placed external to the coarse/fine movement stage so as to be substantially parallel to the predetermined plane with a first measurement beam via a light-transmitting section of the fine movement stage and receives a diffracted light from the first grating section via the light-transmitting section; and
driving the coarse/fine movement stage based on the positional information of the coarse/fine movement stage that has been measured, wherein
a plurality of the encoder heads are fixed to different positions on the coarse movement stage, and the fine movement stage has the light-transmitting section in an area that faces each of the plurality of the encoder heads, and
in the measuring, the positional information of the coarse/fine movement stage within the predetermined plane is measured based on an output of at least one encoder head selected from the plurality of the encoder heads.

84. The stage drive method according to claim 83, wherein on the fine movement stage, a second grating section is arranged at a position that faces each of the plurality of the encoder heads,
in the measuring, positional information of the fine movement stage within the predetermined plane is measured, based on an output of at least one of the encoder heads that irradiates the second grating section that faces the encoder head with a second measurement beam and receives also a diffracted light from the second grating section, and
in the driving, the coarse/fine movement stage is driven, also taking into consideration the positional information of the fine movement stage that has been measured.

85. The stage drive method according to claim 84, wherein the first measurement beam and the second measurement beam are light beams generated from a same light source.

86. The stage drive method according to claim 85, wherein one measurement beam of the first measurement beam and the second measurement beam is generated by extracting at least a part of a diffracted beam within the encoder head, the diffracted beam being diffracted at the grating section to which the other measurement beam corresponds.

87. The stage drive method according to claim 84, wherein in the measuring, a first positional relation between the coarse movement stage and the first grating section in a measurement direction parallel to the predetermined plane and a second positional relation between the coarse movement stage and the second grating section in the measurement direction are computed based on an output from each of the plurality of the encoder heads, and also a positional relation between the fine movement stage and the first grating section in the measurement direction is computed based on the first and second positional relations.

88. The stage drive method according to claim 84, wherein in the measuring, a measurement error of the encoder head that is used for measurement of positional information of the fine movement stage is corrected, the measurement error being caused by inclination of the fine movement stage.

89. The stage drive method according to claim 83, wherein in the measuring, a measurement error of the encoder head that is used for measurement of positional information of the coarse/fine movement stage is corrected, the measurement error being caused by inclination of the coarse movement stage with respect to the predetermined plane.

90. An exposure method of forming a pattern on an object with irradiation of an energy beam, the method comprising:
driving a coarse/fine movement stage in which the object is mounted on the fine movement stage, by using the stage drive method according to claim 83.

91. A device manufacturing method, comprising:
exposing an object using the exposure method according to claim 90; and
developing the object that has been exposed.

* * * * *

UNITED STATES PATENT AND TRADEMARK OFFICE
CERTIFICATE OF CORRECTION

PATENT NO. : 8,274,639 B2
APPLICATION NO. : 12/433063
DATED : September 25, 2012
INVENTOR(S) : Yuichi Shibazaki It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 690 days.

Signed and Sealed this
Twelfth Day of March, 2013

Teresa Stanek Rea
*Acting Director of the United States Patent and Trademark Office*